United States Patent
Mulder et al.

(10) Patent No.: US 12,113,542 B2
(45) Date of Patent: Oct. 8, 2024

(54) CALIBRATION DETECTOR WITH TWO OFFSET COMPENSATION LOOPS

(71) Applicant: AVAGO TECHNOLOGIES INTERNATIONAL SALES PTE. LIMITED, Singapore (SG)

(72) Inventors: Jan Mulder, Houten (NL); Frank Van der Goes, Zeist (NL); Mohammadreza Mehrpoo, Eindhoven (NL); Sijia Wang, Utrecht (NL); Jeffrey Allan Riley, Utrecht (NL)

(73) Assignee: Avago Technologies International Sales Pte. Limited, Singapore (SG)

( * ) Notice: Subject to any disclaimer, the term of this patent is extended or adjusted under 35 U.S.C. 154(b) by 154 days.

(21) Appl. No.: 17/892,001

(22) Filed: Aug. 19, 2022

(65) Prior Publication Data

US 2024/0063808 A1 Feb. 22, 2024

(51) Int. Cl.
*H03M 1/10* (2006.01)

(52) U.S. Cl.
CPC .............................. *H03M 1/1023* (2013.01)

(58) Field of Classification Search
CPC .................................................... H03M 1/1023
See application file for complete search history.

(56) References Cited

U.S. PATENT DOCUMENTS

| | | | | |
|---|---|---|---|---|
| 7,089,146 B1* | 8/2006 | D'Aquino | ................ | G01K 7/01 438/237 |
| 7,528,752 B1* | 5/2009 | Chern | ................. | H03M 1/1019 341/118 |
| 8,912,938 B1* | 12/2014 | Lu | .......................... | H02M 3/157 323/284 |
| 9,810,583 B2* | 11/2017 | Bernardinis | ............. | G01K 7/01 |
| 10,541,699 B1* | 1/2020 | Rutten | .................. | H03M 1/002 |
| 10,594,308 B1* | 3/2020 | Sun | ...................... | H03M 1/0607 |
| 10,673,454 B1* | 6/2020 | Long | ................ | H03K 3/356052 |
| 10,812,094 B2* | 10/2020 | Huang | ................ | H03M 1/1023 |
| 10,903,846 B1* | 1/2021 | Liu | ...................... | H03M 1/0678 |
| 11,476,859 B1* | 10/2022 | Agrawal | ............. | H03M 1/0617 |
| 2011/0018605 A1* | 1/2011 | Cho | .................... | H03M 1/1023 327/307 |
| 2012/0176258 A1* | 7/2012 | Kuttner | ............... | H03M 1/1061 341/118 |
| 2019/0079146 A1* | 3/2019 | Romero | ................... | H10N 52/80 |
| 2019/0379336 A1* | 12/2019 | Takeuchi | ................... | H03F 3/45 |
| 2020/0099385 A1* | 3/2020 | Wang | .................. | H03M 1/1023 |
| 2020/0274544 A1* | 8/2020 | Zhou | .................... | H03M 1/1023 |
| 2022/0115995 A1* | 4/2022 | Lai | ......................... | H03F 3/2171 |
| 2023/0387933 A1* | 11/2023 | Nagarajan | ............... | H03M 1/08 |

* cited by examiner

*Primary Examiner* — Lam T Mai
(74) *Attorney, Agent, or Firm* — Foley & Lardner LLP

(57) ABSTRACT

Described herein are related to a calibration circuit for a digital to analog converter (DAC) including a plurality of DAC cells. The calibration circuit including a chopper circuit configured to receive a first signal from a first DAC cell of the plurality of DAC cells and receive a second signal from a second DAC cell of the plurality of DAC cells. The calibration circuit including a comparator circuit configured to receive the first signal and the second signal from the chopper circuit, provide a third signal indicating at least one of the first signal or the second signal. The calibration circuit also including a second circuit configured to offset a first voltage associated with the comparator circuit and configured to offset a second voltage associated with the chopper circuit.

17 Claims, 10 Drawing Sheets

CALIBRATION DETECTOR WITH TWO OFFSET COMPENSATION LOOPS

BACKGROUND

The present disclosure relates generally to signal converters including but not limited to converters used in radio frequency (RF) systems. More particularly, the present disclosure relates to digital-to-analog convertors (DACs). A DAC often includes an error detector that is used to calibrate the DAC. The error detector can contribute offsets which affect the precision or accuracy of the calibration.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
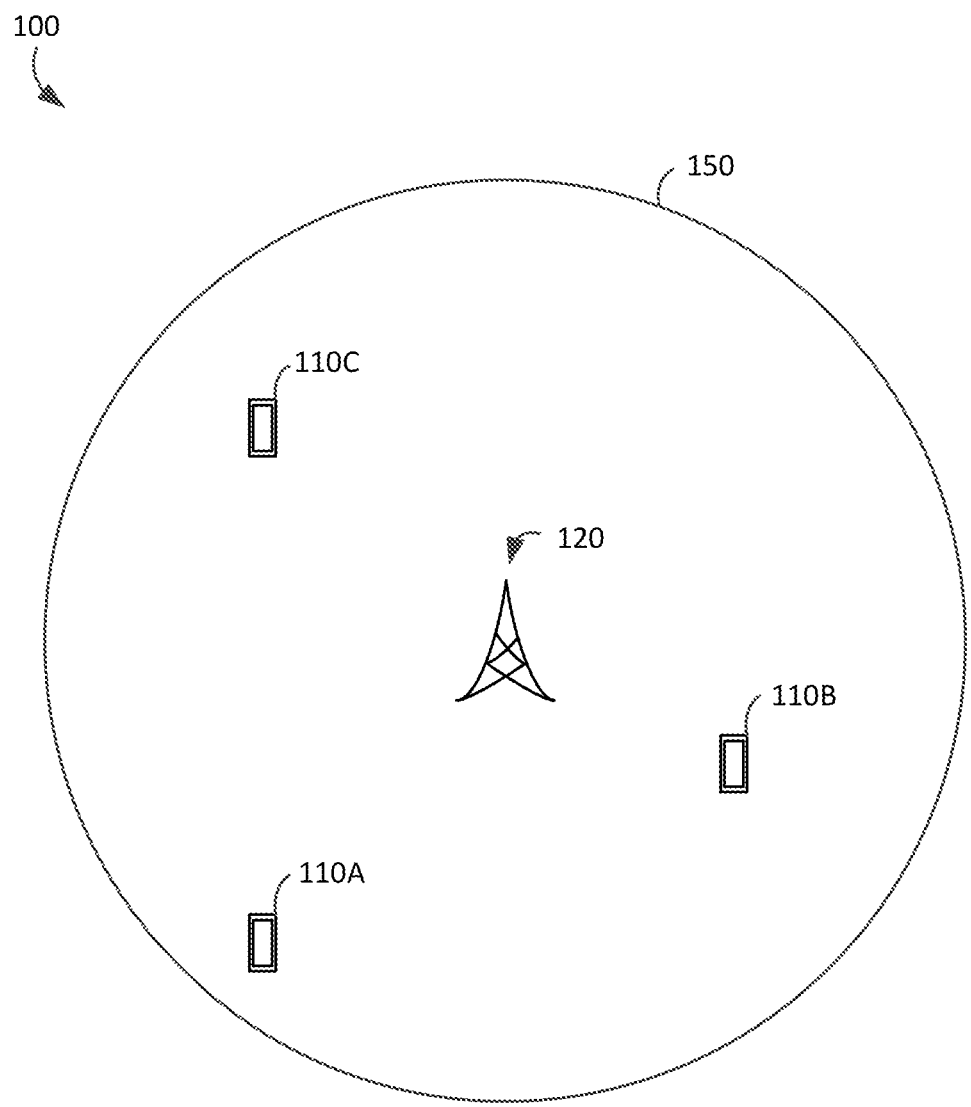
FIG. 1 is a schematic block diagram of a communication system including a base station and client devices, in accordance with some embodiments.

Referring generally to the FIGURES, an example DAC includes a calibration circuit. In some embodiments, systems and methods provide compensation for two types of offsets (e.g., a direct current (DC) offset) and a chopper offset used in a DAC calibration process. In some embodiments, the offsets are associated with error detectors. Chopper offsets are often due to imperfection in chopper switches. The chopper offset can be modulated to chopping frequency and mixed together with the signal and can reduce detection sensitivity. The source of the DC offset is often the detector comparator (e.g., error detector). The DC offset can cause the detector output to be saturated and adversely affects subsequent signal processing.

Disclosed herein are systems and methods related to calibration of a DAC including a number of DAC cells. A cell herein refers to a unit circuit having a set of components in a particular arrangement. Each DAC cell may be configured to receive a corresponding one bit of multiple bits of data, and to provide a current corresponding to the received one bit. In some embodiments, each DAC cell may be configured to receive a number of bits and to provide a current corresponding to the received bits. In one aspect, currents from different DAC cells can be combined to represent the multiple bits of data. For example, an amplitude of the combined current in an analog representation may correspond to the multiple bits of data in a digital representation. In one aspect, calibration can be performed for each DAC cell to reduce errors in performing a digital-to-analog conversion.

In some embodiments, a DAC cell includes a bias control circuit, a driver circuit (or a latch), and a current steering circuit. The bias control circuit may be a circuit configured to provide one or more bias voltages for configuring the driver circuit and the current steering circuit. A bias voltage may be a voltage to set an amount of current flow or a drive strength (e.g., transconductance (gm)) of a transistor or a circuit. A drive strength may be an amount of change in a current provided, in response to a change in a voltage applied. The driver circuit may be a circuit configured to provide a second signal having a first edge, based on a first signal (e.g., bias voltages) from the bias control circuit. An edge of a signal may be a change in a state of the signal from one state to another state. A rising edge may be a change from a low state (e.g., 0V) to a high state (e.g., 1V), and a falling edge may be a change from a high state (e.g., 1V) to a low state (e.g., 0V). The first edge of the second signal may be set or adjusted, according to the drive strength of the driver circuit. For example, the second signal may have a faster edge by increasing the drive strength of the driver circuit. In one aspect, the driver circuit includes an adjustable current source that can set a drive strength, according to the first signal (e.g., bias voltages). In one aspect, the current steering circuit may be a circuit configured to generate or provide a current corresponding to one bit of data. The current steering circuit may be configured to generate a third signal having a second edge, in response to the first edge of the second signal.

Advantageously, each DAC cell can be individually calibrated to reduce timing errors in a digital-to-analog conversion. In one aspect, timing errors or differences in timing of generating currents by different DAC cells can cause errors in combining currents from different DAC cells, and may cause inaccuracy in generating an analog signal corresponding to a digital signal. Disclosed device and method herein may allow adjusting timing of generating the third signal for each DAC cell with high granularity, such that timing errors or differences in timing of generating currents by different DAC cells can be reduced. In one aspect, the first edge (e.g., rising edge) of the second signal is indicative of timing of generating the second edge (e.g., rising edge) of the third signal. For example, the DAC cell may generate the second edge of the third signal, when the first edge of the second signal occurs. Hence, by adjusting a drive strength of a driver circuit of the DAC cell, the first edge of the second signal can be adjusted, and consequently timing of generating the second edge of the third signal can be adjusted. In one aspect, the driver circuit includes an adjustable current source that can adjust the drive strength with high granularity. For example, the adjustable current source includes a set of current sources providing different currents. The combined current from the set of current sources may correspond to the drive strength of the second circuit. The first circuit may provide different bias voltages to the set of current sources, such that currents provided by the set of current sources can be individually configured or controlled. By configuring or controlling different current sources individually, drive strength of a driver circuit in a DAC can be set or adjusted with a high granularity. Moreover, different DAC cells can be calibrated to reduce timing errors in digital-to-analog conversion.

In one aspect, each DAC cell can be individually calibrated to reduce amplitude errors in a digital-to-analog conversion. In one aspect, amplitude errors or differences in amplitudes of currents provided by different DAC cells can cause errors in an amplitude of the combined current from different DAC cells, and may cause inaccuracy in an analog signal generated based on the amplitude of the combined current. Disclosed device and method herein may allow adjusting an amplitude of the third signal for each DAC cell with high granularity, such that amplitude errors or differences in amplitudes of currents provided by different DAC cells can be reduced. In one aspect, the bias control circuit provides a fourth signal (e.g., bias voltages) to the current steering circuit. In one aspect, the current steering circuit includes an adjustable current source that can adjust a current corresponding to the one bit with high granularity. For example, the adjustable current source includes a set of current sources providing different currents. An amplitude of the combined current from the set of current sources may represent or correspond to the one bit. The first circuit may provide different bias voltages to the set of current sources, such that currents provided by the set of current sources can be individually configured or controlled. By configuring or controlling different current sources individually, the amplitude of the current output by the current steering circuit can be set or adjusted with a high granularity. Moreover, different DAC cells can be calibrated to reduce amplitude errors in digital-to-analog conversion.

In one aspect, the DAC is implemented for a wireless communication. For example, the DAC can be implemented in a transmitter for a radio frequency (RF) communication, such as a cellular communication (3G, 4G, 5G, 6G, etc.), Wi-Fi communication, Bluetooth communication etc. In some embodiments, the transmitter is a transmitter of a base station (e.g., eNode B (eNB), gNodeB (gNB), etc.) that provides a wireless communication. In one aspect, the DAC may operate at a high speed (e.g., over 5 Gbps), and may convert a modulated signal at radio frequency in a digital representation into an analog signal in an analog representation. The DAC may provide the analog signal to a preamplifier or a power amplifier for transmission through an antenna, such that an analog upconverter or an analog mixer can be omitted. By omitting the analog upconverter or the analog mixer, the transmitter can reduce power consumption, and can be implemented in a small form factor. Moreover, modulation or upconversion of a signal in a baseband frequency (e.g., 100 MHz 1 GHz) to a RF frequency (1-10 GHz) can be performed by a digital logic circuit that may be less susceptible to noise than an analog circuit, such that the transmitter can improve a signal quality. Although the DAC disclosed herein is provided for a transmitter for a wireless communication, the DAC can be implemented for different applications. For example, the DAC disclosed herein can be implemented for a wired communication, an optical communication, or any computing device that performs high speed digital-to-analog conversion.

In some embodiments, one or more components can be embodied, in whole or part, as one or more transistors. The transistors implemented may be N-type transistors or P-type transistors. N-type transistor is a transistor that utilizes electrons as majority carriers. P-type transistor is a transistor that utilizes holes as majority carriers. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel. In one aspect, a transistor includes a source electrode, a drain electrode and a gate electrode. A source electrode and a drain electrode can be interchangeable, according to voltages applied to the source electrode and the drain electrode. Hence, a source electrode and a drain electrode can be referred to as source/drain electrodes herein. According to a voltage applied to a gate electrode of the transistor, current may flow between a source electrode and a drain electrode. In certain application, a transistor can be implemented as a switch. For example, if a voltage difference between a gate electrode and a source electrode of a transistor is larger than a threshold voltage of the transistor, the transistor can be enabled to electrically couple between the source electrode and the drain electrode of the transistor. For example, if a voltage difference between a gate electrode and a source electrode of a transistor is less than a threshold voltage of the transistor, the transistor can be disabled to electrically decouple between the source electrode and the drain electrode of the transistor.

Various embodiments disclosed herein are related to a calibration circuit for a digital to analog converter (DAC) including a plurality of DAC cells. The calibration circuit includes a chopper circuit configured to receive a first signal and a second signal from the DAC cells. The calibration circuit also includes a comparator circuit configured to receive the first and second signal from the chopper circuit and provide a third signal indicating at least one of the first signal or the second signal. The calibration circuit also includes a second circuit configured to determine a first voltage associated with the comparator circuit, provide a fourth signal to a third circuit, where the third circuit is configured to offset, by providing a fifth signal to the comparator circuit, the first voltage associated with the comparator circuit in response to the fourth signal. The second circuit is also configured to determine a second voltage associated with the chopper circuit and provide a sixth signal to a fourth circuit, where the fourth circuit is configured to offset, by providing a seventh signal to the chopper circuit, the second voltage associated with the chopping circuit in response to the sixth signal.

Some embodiments relate to a calibration system for a circuit in an integrated circuit package. The circuit includes a number of cells, the calibration system includes a chopper circuit configured to receive a first signal from a first cell of the number of cells and a second signal from a second cell of the number of cells, a comparator circuit configured to receive the first signal and the second signal from the chopper circuit and provide a third signal indicating at least one of the first signal or the second signal for use in calibration. The calibration system also includes a compensation circuit configured to offset a first voltage associated with the comparator circuit and configured to offset a second voltage associated with the chopper circuit. The calibration system is a circuit and can be part of the circuit in the integrated circuit package.

In some embodiments, the compensation circuit is configured to determine that the first signal and the second signal are the same and determine the first voltage associated with the comparator circuit in response to the compensation circuit detecting a third voltage associated with the third signal. The third voltage associated with the third signal indicates the first voltage associated with the comparator circuit.

In some embodiments, the compensation circuit is configured to provide, in response to the compensation circuit determining the first voltage associated with the comparator circuit, a fourth signal to the comparator circuit, wherein the fourth signal includes a fourth voltage that offsets the first voltage associated with the comparator circuit.

In some embodiments, the compensation circuit is configured to determine that the first signal and the second signal are the same and determine the second voltage associated with the chopper circuit in response to the compensation circuit detecting a fifth voltage associated with the third signal. The fifth voltage associated with the third signal indicates the second voltage associated with the chopper circuit.

In some embodiments, the compensation circuit is configured to provide, in response to the compensation circuit determining the second voltage associated with the chopper circuit, a fifth signal to the chopper circuit. The fifth signal includes a sixth voltage that offsets the second voltage associated with the chopper circuit.

In some embodiments, the compensation circuit is configured to provide a sixth signal. The sixth signal indicates at least one of the first signal or the second signal. The compensation circuit provides the sixth signal in response to the compensation circuit offsetting the first voltage associated with the comparator circuit.

In some embodiments, the compensation circuit includes at least one digital to analog convertor cell and at least one chopper circuit.

In some embodiments, the compensation circuit is configured to provide a seventh voltage that offsets the first voltage associated with the comparator circuit. The seventh voltage includes a first polarity that is different than a second polarity. The first voltage associate with the comparator circuit includes the second polarity.

In some embodiments, the compensation circuit is configured to provide an eighth voltage that offsets the second voltage associated with the chopper circuit. The eighth voltage includes a third polarity that is different than a fourth polarity. The second voltage associated with the chopper circuit includes the fourth polarity.

Some embodiments relate to a calibration circuit for a digital to analog converter. The calibration circuit includes a chopper circuit configured to receive a first signal and a second signal, a comparator circuit configured to receive the first signal and the second signal from the chopper circuit and provide a third signal indicating at least one of the first signal or the second signal, and a second circuit configured to provide a first loop to adjust a first offset voltage associated with the comparator circuit and to provide a second loop to adjust a second offset voltage associated with the chopper circuit.

In some embodiments, the second circuit is configured to determine that the first signal and the second signal are the same and determine the first offset voltage associated with the comparator circuit in response to the second circuit detecting a first voltage associated with the third signal. The first voltage associated with the third signal indicates the first offset voltage associated with the comparator circuit.

In some embodiments, the calibration circuit further includes a third circuit configured to receive a fourth signal that includes the first offset voltage associated with the comparator circuit and provide a fifth signal to the comparator circuit. The fifth signal includes a second voltage that offsets the first offset voltage associated with the comparator circuit.

In some embodiments, the second circuit is configured to determine that first signal and the second signal are the same and determine the second offset voltage associated with the chopper circuit in response to the second circuit detecting a third voltage associated with the third signal. The third voltage associated with the third signal indicates the second offset voltage associated with the chopper circuit.

In some embodiments, the calibration circuit also includes a fourth circuit configured to receive a sixth signal that includes the second offset voltage associated with the chopper circuit and provide a seventh signal to the chopper circuit. The seventh signal includes a fourth voltage that offsets the second offset voltage associated with the chopper circuit.

In some embodiments, the second circuit is configured to provide an eighth signal. The eighth signal indicates at least one of the first signal or the second signal. The second circuit provides the eighth signal in response to the second circuit providing the first loop and the second loop.

In some embodiments, the calibration circuit also includes a third circuit configured to provide a fifth voltage that offsets the first offset voltage associated with the comparator circuit. The fifth voltage includes a first polarity that is different than a second polarity. The first offset voltage associated with the comparator circuit includes the second polarity.

In some embodiments, the calibration circuit also includes a fourth circuit configured to provide a sixth voltage that offsets the second offset voltage associated with the chopper circuit. The sixth voltage includes a third polarity that is different than a fourth polarity. The second offset voltage associated with the chopper circuit includes the fourth polarity.

Some embodiments relate to a method of adjusting a calibration circuit. The calibration circuit including a comparator, DAC cells, and a chopper circuit. The method includes adjusting a first offset voltage associated with the comparator and adjusting a second offset voltage associated with the chopper circuit.

In some embodiments, the method also includes providing, by a third circuit, a first voltage that offsets the first offset voltage associated with the comparator. The first voltage has a first polarity that is different than a second polarity. The first offset voltage associated with the comparator includes the second polarity.

In some embodiments, the method also includes providing, by a fourth circuit, a second voltage that offsets the second offset voltage associated with the chopper circuit. The second voltage has a third polarity that is different than a fourth polarity. The second offset voltage associated with the chopper circuit includes the fourth polarity.

FIG. 1 illustrates a communication system 100 including a base station 120 and client devices 110A, 110B, 110C, in accordance with some embodiments. The base station 120 and the client devices 110A, 110B, 110C may communicate through a wireless communication link. A wireless communication link may be a cellular communication link conforming to 3G, 4G, 5G, 6G, or other cellular communication protocols. In one aspect, the client devices 110A . . . 110C are located within a geographical boundary 150 with respect to the base station 120, and may communicate with or through the base station 120. In some embodiments, the communication system 100 includes more, fewer, or different number of base stations 120 and/or client devices 110 than shown in FIG. 1.

In some embodiments, the client device 110 may be a user device such as a mobile phone, a smart phone, a personal digital assistant (PDA), tablet, laptop computer, wearable computing device (e.g., head mounted display, smart watch), etc. A client device 110 may be also referred to as user equipment (UE). Each client device 110 may communicate with the base station 120 through a corresponding communication link. For example, the client device 110 may transmit or provide a wireless signal at RF to a base station 120 through a wireless communication link (e.g., 3G, 4G, 5G, 6G or other cellular communication link), and/or receive a wireless signal at RF from the base station 120 through the wireless communication link (e.g., 3G, 4G, 5G, 6G or other cellular communication link). A wireless signal may be a signal exchanged or provided through a wireless medium (e.g., air). The wireless signal may include or carry data such as video data, audio data, image data, text, etc.

In some embodiments, the base station 120 may be a device configured to provide a wireless communication to client devices 110 within a geographical boundary 150. Examples of the base station include eNB, gNB, etc. The base station 120 may be communicatively coupled to another base station 120 or other communication devices through a wireless communication link and/or a wired communication link. The base station 120 may receive a wireless signal at RF from a client device 110 or another base station 120 through a wireless communication link. Additionally or alternatively, the base station 120 may transmit or provide a wireless signal at RF to another client device 110, another base station 120, or another communication device through a wireless communication link. Hence, the base station 120 allows communication among client devices 110 associated with the base station 120, or other client devices 110 associated with different base stations 120.

Figure 2:
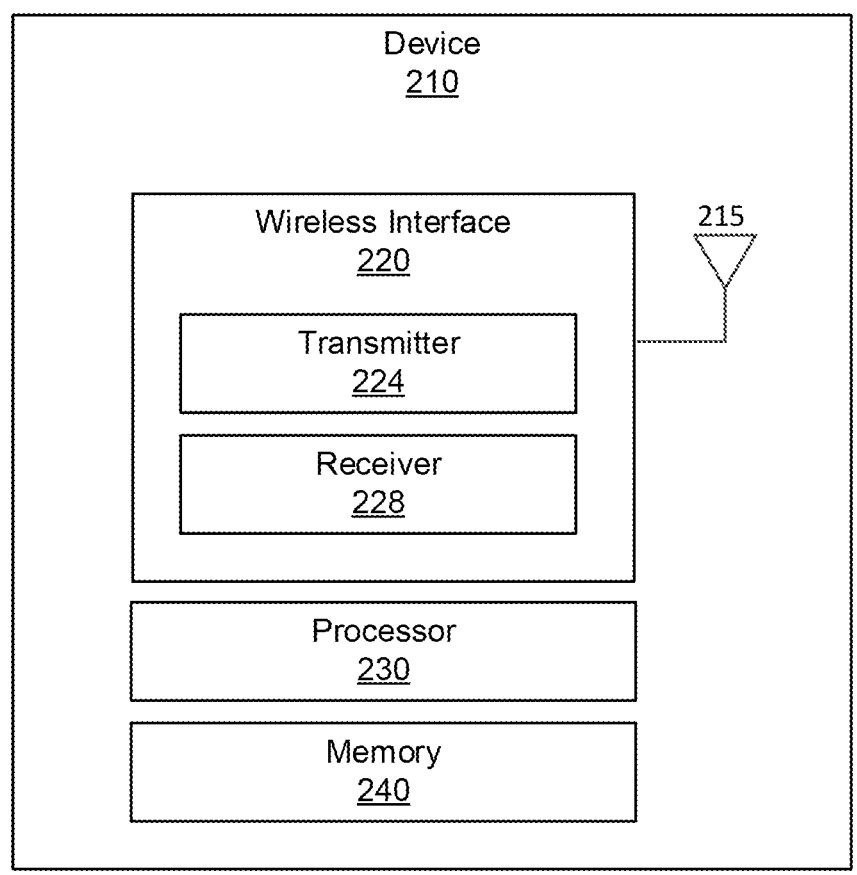
FIG. 2 is a schematic block diagram of a device for communication through a wireless communication link, in accordance with some embodiments.

FIG. 2 illustrates a block diagram of a device 210 for communication through a wireless communication link, in accordance with some embodiments. In some embodiments, the device 210 may be the base station 120, the client device 110, or any device that can communicate through a wireless communication link. In some embodiments, the device 210 includes an antenna 215, a wireless interface 220, a processor 230, and a memory device 240. These components may be embodied as hardware, software, firmware, or a combination thereof. In some embodiments, the device 210 includes more, fewer, or different components than shown in FIG. 2. For example, the device 210 may include an electronic display and/or an input device. For example, the device 210 may include additional antennas 215 and additional wireless interfaces 220 than shown in FIG. 2.

In some embodiments, the antenna 215 is a component that may receive a wireless signal at RF and/or transmit a wireless signal at RF through a wireless medium (e.g., air). The antenna 215 may be a dipole antenna, a patch antenna, a ring antenna, or any suitable antenna for wireless communication. In one aspect, a single antenna 215 is utilized for both transmitting a wireless signal and receiving a wireless signal. For receiving a wireless signal, the antenna 215 may detect a wireless signal having a change in an electromagnetic wave in a wireless medium (e.g., air), and provide, to the wireless interface 220, an electrical signal at RF having a voltage and/or a current corresponding to the detected change in the electromagnetic wave. An electrical signal at RF may be referred to as a RF signal herein. For transmitting a wireless signal, the antenna 215 may receive, from the wireless interface 220, an electrical signal at RF having a voltage and/or a current, and transmit, through the wireless medium (e.g., air), a wireless signal having a change in an electromagnetic wave corresponding to the electrical signal. In some embodiments, different antennas 215 can be utilized for transmitting the wireless signal and receiving the wireless signal. In some embodiments, multiple antennas 215 can be utilized to support multiple-in, multiple-out (MIMO) communication.

In some embodiments, the wireless interface 220 is a circuit or a component that may provide a RF signal to the antenna 215 or receive a RF signal from the antenna 215. In some embodiments, the wireless interface 220 includes a transmitter 224 and a receiver 228. In some embodiments, the transmitter 224 and the receiver 228 may be implemented in a same integrated circuit. In some embodiments, the transmitter 224 and the receiver 228 may be implemented in different integrated circuits. A transmitter 224 may be a circuit or a component that generates or provides a RF signal for transmitting data. In one aspect, the transmitter 224 may receive a baseband signal including or representing data (e.g., audio data, image data, text, or any data) for transmission at a baseband frequency (e.g., 0~1 GHz) from the processor 230, and upconvert the baseband signal to generate a RF signal. The transmitter 224 may provide the RF signal to an antenna 215 for transmission. A receiver 228 may be a circuit or a component that receives a RF signal for receiving data. In one aspect, the receiver 228 may receive a RF signal at the RF from an antenna 215, and downconvert the RF signal to a baseband frequency (e.g., 0~1 GHz) to obtain a downconverted signal at the baseband frequency. The downconverted signal at the baseband frequency may include or represent data (e.g., audio data, image data, text, or any data) generated by another device (e.g., another base station 120, another client device 110, etc.). The receiver 228 may provide the downconverted signal to the processor 230. In one configuration, the transmitter 224 and the receiver 228 may be coupled to the same antenna 215. In one configuration, the transmitter 224 and the receiver 228 may be coupled to different antennas 215.

The processor 230 is a component that processes data. The processor 230 may be embodied as FPGA, ASIC, a logic circuit, etc. The processor 230 may obtain instructions from the memory device 240, and execute the instructions. In one aspect, the processor 230 may receive the downconverted signal at the baseband frequency from the wireless interface 220, and decode or process data included in or represented by the downconverted signal. For example, the processor 230 may obtain audio data or image data from the downconverted signal. In one aspect, the processor 230 may generate or obtain data for transmission at the baseband frequency, and encode or process the data. For example, the processor 230 may encode or process image data or audio data at the baseband frequency, and provide a baseband signal including or representing the encoded or processed data to the wireless interface 220 for transmission.

The memory device 240 is a component that stores data. The memory device 240 may be embodied as RAM, flash memory, ROM, EPROM, EEPROM, registers, a hard disk, a removable disk, a CD-ROM, or any device capable for storing data. The memory device 240 may be embodied as a non-transitory computer readable medium storing instructions executable by the processor 230 to perform various functions of the device 210 disclosed herein. In some embodiments, the memory device 240 and the processor 230 are integrated as a single component (or an integrated circuit). In some embodiments, the memory device 240, the processor 230, and the wireless interface 220 are integrated as a single component (or an integrated circuit). In some embodiments, the memory device 240, the processor 230, and the wireless interface 220 are implemented as discrete components (or separate integrated circuits).

Figure 3:
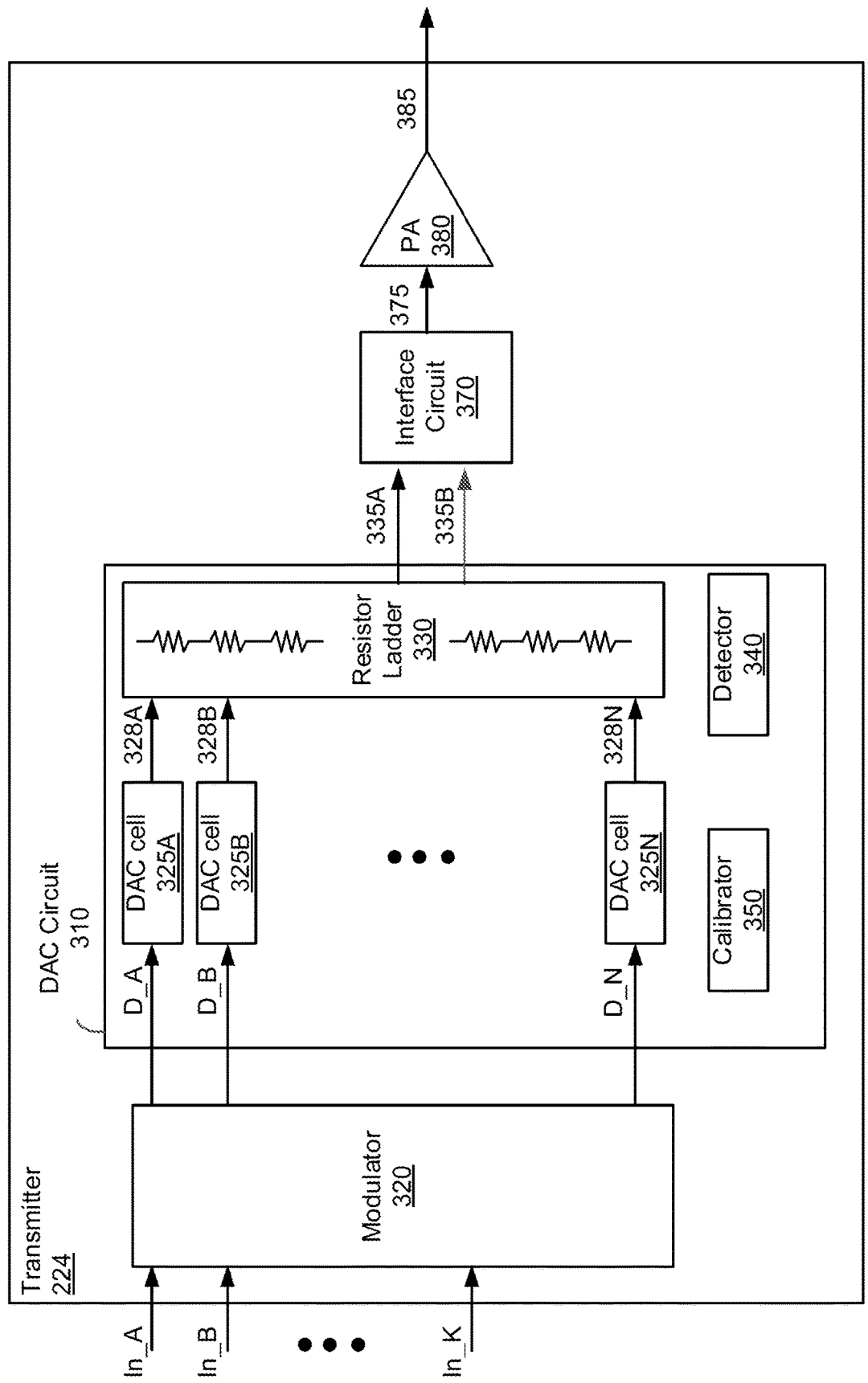
FIG. 3 is a schematic block diagram of a transmitter, in accordance with some embodiments.

FIG. 3 illustrates a schematic diagram of a transmitter 224, in accordance with some embodiments. In some embodiments, the transmitter 224 includes a DAC 310 (also referred to as "a DAC circuit 310"), a modulator 320, an interface circuit 370, and a power amplifier (PA) 380. These components may operate together to generate a RF signal 385 for transmission. In one aspect, the modulator 320 operates in a digital domain, where the interface circuit 370 and the PA 380 operate in an analog domain. The DAC circuit 310 may operate in both the analog domain and the digital domain, and may operate as an interface between the modulator 320 operating in the digital domain and the interface circuit 370 and the PA 380 operating in the analog domain. In some embodiments, the transmitter 224 includes more, fewer, or different components than shown in FIG. 3. For example, the modulator 320 may be implemented as part of the processor 230.

In some embodiments, the modulator 320 is a circuit or a component that may receive a baseband signal including K-bit data In_A . . . In_K in a digital representation, and perform modulation or upconversion on the K-bit data In_A . . . In_K. A modulation or an upconversion may be multiplying a value represented by the K-bit data In_A . . . In_K by a sine function or a cosine function of a carrier frequency at RF. A carrier frequency may be a frequency (e.g., 2 GHz or 60 GHz), at which a wireless signal can be transmitted. In one approach, the modulator 320 can perform multiplication of the value represented by the K-bit data In_A . . . In_K and the sine function or the cosine function of the carrier frequency by a digital logic circuit to obtain N-bit data D_A . . . D_N representing an upconverted signal at RF. The modulator 320 may provide the N-bit data D_A . . . D_N in a digital representation to the DAC circuit 310.

In some embodiments, the DAC circuit 310 is a circuit or a component that may perform a digital-to-analog conversion. In some embodiments, the DAC circuit 310 includes a plurality of DAC cells 325A . . . 325N, a resistor ladder 330, a detector 340, and a calibrator 350. These components may operate together to receive N-bit data D_A . . . D_N in a digital representation, and provide signals 335A, 335B in an analog representation corresponding to the N-bit data D_A . . . D_N. For example, voltage amplitudes of the signals 335A, 335B may represent or correspond to a value of the N-bit data D_A . . . D_N. In some embodiments, the DAC circuit 310 includes more, fewer, or different components than shown in FIG. 3.

In some embodiments, a DAC cell 325 is a circuit or a component that may receive one bit data D, and generate a current 328 corresponding to the one bit data D. In one configuration, the DAC cell 325 includes an input port coupled to the modulator 320, and an output port coupled to a corresponding resistor of the resistor ladder 330. A port may be a pad, a metal rail, or any conductive component that can receive or provide an electrical signal (e.g., a voltage or a current). An input port may be a port to receive a signal, where an output port may be a port to provide or output a signal. In this configuration, a DAC cell 325 may receive a one bit data D, and provide a current 328 having an amplitude corresponding to the one bit data D. For example, in response to the one bit data D having a value '0', the DAC cell 325 may bypass providing a current. For example, in response to the one bit data D having a value '1', the DAC cell 325 may provide a current 328 having a certain amplitude to the resistor ladder 330. Detailed description on implementations and operations of the DAC cell 325 is provided below with respect to FIG. 4.

In some embodiments, the resistor ladder 330 is a circuit or a component that can provide voltage signals 335A, 335B corresponding to currents 328A . . . 328N from a set of DAC cells 325A . . . 325N. In one configuration, the resistor ladder 330 includes various resistors connected in a R-2R configuration. In one configuration, output ports of different DAC cells 325A can be coupled to corresponding resistors of the resistor ladder 330. In one configuration, the resistor ladder 330 includes output ports coupled to input ports of the interface circuit 370. In this configuration, the resistor ladder 330 can combine currents 328A . . . 328N from the set of DAC cells 325, and generate or provide voltage signals 335A, 335B corresponding to the combined current. The voltage signals 335A, 335B may be differential signals having opposite phases with each other. In one aspect, an amplitude of the combined current corresponds to amplitudes of the voltage signals 335A, 335B. For example, for '0001' of 4-bit input data corresponding to a value '1', a difference in amplitudes of the voltage signals 335A, 335B may be 100 mV corresponding to a current from a single DAC cell 325. For example, for '0111' of 4-bit input data corresponding to a value '3', a difference in amplitudes of the voltage signals 335A, 335B may be 300 mV corresponding to currents from three DAC cells 325. The resistor ladder 330 may provide the voltage signals 335A, 335B at its output ports.

In some embodiments, the detector 340 is a circuit or a component that may detect an error in one or more DAC cells 325. The detector 340 can be implemented as an analog circuit, a digital logic circuit, or a combination of the analog circuit and the digital logic circuit. In one configuration, the detector 340 includes one or more input ports coupled to the resistor ladder 330, and an output port coupled to an input port of the calibrator 350. In this configuration, the detector 340 can detect characteristics of one or more DAC cells 325. Examples of characteristics of a DAC cell 325 include a timing of providing a current 328, an amplitude of the current 328, etc. The detector 340 may generate one or more feedback signals indicating the detected characteristics of a DAC cell 325, and provide the one or more feedback signals to the calibrator 350.

In some embodiments, the calibrator 350 is a circuit or a component that can perform calibration of DAC cells 325. In one aspect, each DAC cell 325 may have errors due to a process corner variation, a voltage variation, a temperature variation, or a combination of them. Examples of errors may include a timing error and an amplitude error. For example, timing errors or differences in timing of providing currents 328A . . . 328N by different DAC cells 325 can cause errors in combining currents 328A . . . 328N from different DAC cells 325, and may cause inaccuracy in generating the voltage signals 335A, 335B corresponding to N-bit data. For example, if a particular DAC cell 325 provides a current 328 later than other DAC cells 325 or does not provide a current 328 at a time period allocated for providing the current 328, then the current 328 from the DAC cell 325 may not be combined properly, and may cause the amplitudes of the voltage signals 335A, 335B to represent a wrong value of a N-bit data. For example, amplitude errors or differences in amplitudes of currents 328A . . . 328N provided by different DAC cells 325A . . . 325N can cause errors in an amplitude of the combined current from different DAC cells 325A . .

. 325N, and may cause inaccuracy in amplitudes of the voltage signals 335A, 335B generated based on the combined current. For example, if a particular DAC cell 325 provides a current 328 having an amplitude less than or larger than amplitudes of currents 328 from other DAC cells 325, then the amplitudes of the voltage signals 335A, 335B generated based on the combined current may represent a wrong value of a N-bit data. In one aspect, the calibrator 350 can configure or adjust each DAC cell 325 to reduce timing errors and amplitude errors.

In one aspect, the calibrator 350 may receive one or more feedback signals indicative of characteristics of one or more DAC cells 325 from the detector 340, and adjust a configuration or setting of each DAC cell 325 according to the one or more feedback signals. Examples of configuration or setting of a DAC cell 325 include a configuration to adjust a drive strength of generating or providing the current 328 and/or a configuration to adjust an amplitude of the current 328. The calibrator 350 may determine a target configuration or a target setting of each DAC cell 325, and provide a configuration signal indicating the determined configuration or setting to each DAC cell 325. For example, if the calibrator 350 determines, based on one or more feedback signals, that a particular DAC cell 325 is slower than other DAC cells 325, the calibrator 350 may generate a configuration signal causing the DAC cell 325 to increase a drive strength to provide the current 328 faster. For example, if the calibrator 350 determines, based on one or more feedback signals, that a particular DAC cell 325 provides a current 328 with an amplitude larger than amplitudes of currents 328 provided by other DAC cells 325, the calibrator 350 may generate a configuration signal causing the DAC cell 325 to provide the current 328 with a lower amplitude.

In some embodiments, the interface circuit 370 is a circuit or a component that may interface between the DAC circuit 310 and the PA 380. Examples of the interface circuit 370 include a balun, an impedance matching circuit, etc. In one configuration, the interface circuit 370 includes a first input port coupled to a first output port of the resistor ladder 330, a second input port coupled to a second output port of the resistor ladder 330, and an output port coupled to an input port of the PA 380. In this configuration, the interface circuit 370 may convert differential signals 335A, 335B into a signal 375. For example, the interface circuit 370 may obtain a difference in amplitudes of the signals 335A, 335B, and provide the difference as the signal 375. In one aspect, the interface circuit 370 may provide impedance matching between the DAC circuit 310 and the PA 380, such that the input port of the PA 380 may have a certain impedance within a range (e.g., 40~60 ohm) to ensure that the PA 380 can operate properly.

In some embodiments, the PA 380 is a circuit or a component that can amplify the signal 375 to obtain the RF signal 385 for driving the antenna 215. In some embodiments, the PA 380 includes a single amplifier circuit or two or more amplifier circuits connected in cascade. In one configuration, the PA 380 includes an input port coupled to an output port of the interface circuit 370, and an output port coupled to the antenna 215. In this configuration, the PA 380 can amplify an amplitude of the signal 375 to obtain the RF signal 385 having an amplified amplitude, and provide the RF signal 385 to the antenna 215 for transmission.

Figure 4:
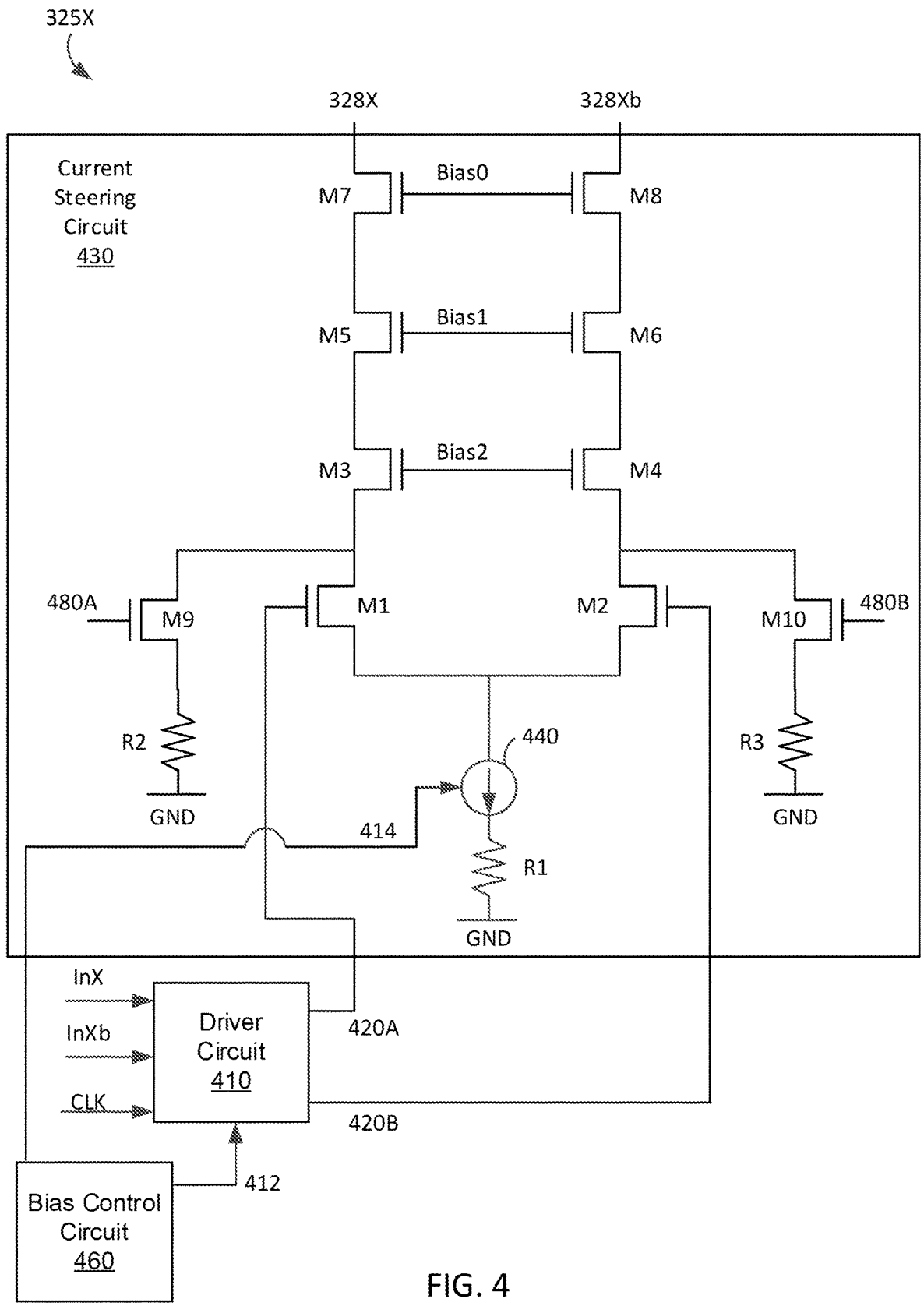
FIG. 4 is a schematic block diagram of a digital-to-analog converter (DAC) cell, in accordance with some embodiments.

FIG. 4 illustrates a schematic diagram of a DAC cell 325X, in accordance with some embodiments. The DAC cell 325X may be one of the DAC cells 325A . . . 325N. In some embodiments, the DAC cell 325X includes a current steering circuit 430, a driver circuit 410, and a bias control circuit 460. These components may operate together to provide currents 328X, 328Xb, corresponding to input signals InX, InXb. In some embodiments, the DAC cell 325X includes more, fewer, or different components than shown in FIG. 4.

In one aspect, the input signals InX, InXb may be or may correspond to one of the bits D_A . . . D_B. The input signals InX, InXb may be provided by the modulator 320. The input signals InX, InXb may be differential signals having opposite phases to represent one bit. For example, the input signal InX may have one of a first voltage (e.g., VDD or 1V) or a second voltage (e.g., GND or 0V) lower than the first voltage and the input signal InXb may have the other of the first voltage or the second voltage, according to a value of one bit to represent. For example, the input signal InX having the first voltage and the input signal InXb having the second voltage lower than the first voltage may represent a value '1' of one bit. For example, the input signal InX having the second voltage and the input signal InXb having the first voltage higher than the second voltage may represent a value '0' of one bit.

In some embodiments, the bias control circuit 460 is a circuit or a component that can provide bias voltages to the driver circuit 410 and/or the current steering circuit 430. The bias control circuit 460 may include or may be implemented as one or more logic circuits. The bias control circuit 460 may receive, from the calibrator 350, a configuration signal 432 indicating configurations or settings of the DAC cell 325X, and determine one or more bias voltages for the driver circuit 410 and/or the current steering circuit 430, according to the configurations or settings indicated by the configuration signal 432. The bias control circuit 460 may provide or apply one or more bias voltages 412 to the driver circuit 410 and one or more bias voltages 414 to the current steering circuit 430, according to configurations or settings indicated by the configuration signal 432. For example, for a configuration signal 432 indicating the DAC cell 325X to have a particular timing of generating currents 328X, 328Xb, the bias control circuit 460 may provide one or more bias voltages 412 to the driver circuit 410, such that the driver circuit 410 can have a particular drive strength according to the one or more bias voltages 412 to adjust the timing of generating the currents 328X, 328Xb. For example, for a configuration signal 432 indicating the DAC cell 325X to provide the currents 328X, 328Xb with a particular amplitude, the bias control circuit 460 may provide one or more bias voltages 414 to the current steering circuit 430, such that the current steering circuit 430 can set or adjust an amplitude of the currents 328X, 328Xb according to the one or more bias voltages 414. In some embodiments, the bias control circuit 460 can also generate bias voltages Bias0, Bias1, Bias2, and provide the bias voltages Bias0, Bias1, Bias2 to the current steering circuit 430.

In some embodiments, the driver circuit 410 is a circuit or a component that may provide signals 420A, 420B corresponding to the input signals InX, InXb to the current steering circuit 430, in response to the clock signal CLK. In some embodiments, the driver circuit 410 can include a latch or a flip flop. The driver circuit 410 may also include a level shifter or may be coupled to a level shifter. The level shifter can shift voltage levels of the signals 420A, 420B to have particular voltages amplitudes and/or a common mode voltage suitable for driving the current steering circuit 430. The signals 420A, 420B may be differential signals having opposite phases. In one aspect, the signals 420A, 420B may correspond to one bit represented by the input signals InX, InXb. For example, in response to the input signal InX having a higher voltage than the input signal InXb, the signal 420A may have a higher voltage than the signal 420B. For example, in response to the input signal InXb having a higher voltage than the input signal InX, the signal 420B may have a higher voltage than the signal 420A. In one aspect, the driver circuit 410 receives the input signals InX, InXb and provides the signals 420A, 420B, at a timing indicated by the clock signal CLK. A clock signal CLK may be a signal that toggles between two voltages periodically. In one aspect, according to a state, a voltage, or an edge of the clock signal CLK, the driver circuit 410 may receive the input signals InX, InXb and provide the signals 420A, 420B to the current steering circuit 430. For example, in response to the clock signal CLK having a first voltage (e.g., VDD or 1V), the driver circuit 410 may receive the input signals InX, InXb, and provide, to the current steering circuit 430, the signals 420A, 420B corresponding to the input signals InX, InXb. For example, in response to the clock signal CLK having a second voltage (e.g., GND or 0V), the driver circuit 410 may not provide, to current steering circuit 430, the signals 420A, 420B corresponding to the input signals InX, InXb.

In one aspect, the driver circuit 410 can set, change or adjust a drive strength to adjust timing of providing the signals 420A, 420B. A drive strength may be an amount of change in a current provided, in response to a change in a voltage applied. In one aspect, the driver circuit 410 can receive one or more bias voltage 412 from the bias control circuit 460, and set or adjust the drive strength, according to the one or more bias voltages 412. According to the drive strength, the driver circuit 410 can change or set timing of generating edges of the signals 420A, 420B.

In some embodiments, the current steering circuit 430 is a circuit or a component that may provide currents 328X, 328Xb indicative of one bit represented by the input signals InX, InXb. In some embodiments, the current steering circuit 430 includes transistors M1-M10, resistors R1-R3, and an adjustable current source 440. These components may operate together to receive the signals 420A, 420B, and provide the currents 328X, 328Xb, according to the signals 420A, 420B. In some embodiments, the current steering circuit 430 includes more, fewer, or different components than shown in FIG. 4.

In one aspect, currents 328X, 328Xb may correspond to one of the currents 328A . . . 328N. Currents 328X, 328Xb may be differential signals having opposite phases to indicate a value represented by the input signals InX, InXb. For example, the current 328X being larger or having a larger amplitude than the current 328Xb may correspond to one bit '1' represented by the input signals InX, InXb. For example, the current 328Xb being larger or having a larger amplitude than current 328X may correspond to one bit '0' represented by the input signals InX, InXb.

In one aspect, the resistor R1 and the adjustable current source 440 may operate together to set or adjust an amount or amplitude of currents 328X, 328Xb. The resistor R1 may be a component that provides a certain resistance. The adjustable current source 440 may be a circuit or a component that provides a current having an amplitude corresponding to one or more bias voltages 414. The adjustable current source 440 may include or may be implemented as one or more transistors. In one configuration, the resistor R1 includes a first electrode coupled to a metal rail providing a ground voltage (e.g., GND or 0V), and a second electrode coupled to the adjustable current source 440. In one configuration, the adjustable current source 440 includes a first port coupled to the driver circuit 410 to receive one or more bias voltages, a second port coupled to the second electrode of the resistor R1, and a third port coupled to the transistors M1, M2. In this configuration, the adjustable current source 440 may conduct current through the resistor R1, according to the one or more bias voltages 414. For example, an amplitude of the current through the resistor R1 may be set or adjusted, according to the one or more bias voltages 414. In one aspect, the current through the resistor R1 may flow through the transistor M1, the transistor M2, or both.

In one aspect, the transistors M1, M2 may operate as a differential pair circuit to steer the current from the adjustable current source 440. The transistors M1, M2 may be MOSFETs, FinFETs, GaaFETs, or any transistors. The transistors M1, M2 may be N-type transistors. In some embodiments, the transistors M1, M2 may be implemented as P-type transistors. In one configuration, the transistor M1 includes i) a source electrode coupled to the third port of the adjustable current source 440, ii) a gate electrode coupled to the driver circuit 410 to receive the signal 420A, and iii) a drain electrode coupled to the transistor M3. In one configuration, the transistor M2 includes i) a source electrode coupled to the third port of the adjustable current source 440, ii) a gate electrode coupled to the driver circuit 410 to receive the signal 420B, and iii) a drain electrode coupled to the transistor M4. In this configuration, either the transistor M1 or the transistor M2 can be selectively enabled to steer current from the adjustable current source 440. For example, if the signal 420A has a higher voltage than the signal 420B, then the transistor M1 can conduct or provide a larger portion of the current from the adjustable current source 440 than the transistor M2. For example, if the signal 420B has a higher voltage than the signal 420A, then the transistor M2 can conduct or provide a larger portion of the current from the adjustable current source 440 than the transistor M1. The current conducted or provided by the transistor M1 may be the current 328X, and the current conducted or provided by the transistor M2 may be the current 328Xb. In one aspect, a sum of the currents 328X, 328Xb may be the current provided by the adjustable current source 440.

In one aspect, the transistors M3-M8 may operate as cascode transistors to protect the transistors M1, M2. The transistors M3, M8 may be MOSFETs, FinFETs, GaaFETs, or any transistors. The transistors M3-M8 may be N-type transistors. In some embodiments, some of the transistors M3-M8 may be implemented as P-type transistors. For example, the transistors M7, M8 may be omitted, the transistors M5-M8 may be omitted, or the transistors M3-M8 may be omitted.

In one configuration, the transistor M3 includes i) a source electrode coupled to the drain electrode of the transistor M1, ii) a gate electrode coupled to a gate electrode of the transistor M4, and iii) a drain electrode coupled to a source electrode of the transistor M5. In one configuration, the transistor M4 includes i) a source electrode coupled to the drain electrode of the transistor M2, ii) a gate electrode coupled to the gate electrode of the transistor M3, and iii) a drain electrode coupled to a source electrode of the transistor M6. Gate electrodes of the transistors M3, M4 may be coupled to the bias control circuit 460 to receive a bias voltage Bias0.

In one configuration, the transistor M5 includes i) a source electrode coupled to the drain electrode of the transistor M3, ii) a gate electrode coupled to a gate electrode of the transistor M6, and iii) a drain electrode coupled to a source electrode of the transistor M7. In one configuration, the transistor M6 includes i) a source electrode coupled to the drain electrode of the transistor M4, ii) a gate electrode coupled to the gate electrode of the transistor M5, and iii) a drain electrode coupled to a source electrode of the transistor M8. Gate electrodes of the transistors M5, M6 may be coupled to the bias control circuit 460 to receive a bias voltage Bias1.

In one configuration, the transistor M7 includes i) a source electrode coupled to the drain electrode of the transistor M5, ii) a gate electrode coupled to a gate electrode of the transistor M8, and iii) a drain electrode coupled to one or more resistors of the resistor ladder 330. In one configuration, the transistor M8 includes i) a source electrode coupled to the drain electrode of the transistor M6, ii) a gate electrode coupled to the gate electrode of the transistor M7, and iii) a drain electrode coupled to one or more resistors of the resistor ladder 330. Gate electrodes of the transistors M7, M8 may be coupled to the bias control circuit 460 to receive a bias voltage Bias2.

In this configuration, the transistors M3, M5, M7 operate as cascode transistors coupled to the transistor M1 in series. Similarly, the transistors M2, M4, M6 operate as cascode transistors coupled to the transistor M2 in series. A cascode transistor can help alleviate a voltage stress. In one example, a voltage having an amplitude larger than a tolerable stress voltage of a transistor across a source electrode and a drain electrode of the transistor can damage the transistor. By implementing one or more cascode transistors, a large voltage can be distributed among the transistors connected in series. For example, a voltage between the source electrode of the transistor M1 and the drain electrode of the transistor M7 can be shared or distributed among the transistors M1, M3, M5, M7, such that the transistor M1 can be protected. For example, a voltage between the source electrode of the transistor M2 and the drain electrode of the transistor M8 can be shared or distributed among the transistors M2, M4, M6, M8, such that the transistor M2 can be protected.

In one aspect, the transistor M9 and the resistor R2 may operate together to provide a current to ensure that the cascode transistors M3, M5, M7 operate properly, when a current from the adjustable current source 440 is provided as the current 328Xb through the transistors M2, M4, M6, M8. The current provided by the transistor M9 and the resistor R2 may be referred to as a bleeding current. The bleeding current may be 5~10% of the current provided by the adjustable current source 440. The transistor M9 may be a MOSFET, a FinFET, a GaaFET, or any transistor. The transistor M9 may be a N-type transistor. In some embodiments, the transistor M9 may be implemented as a P-type transistor. In one configuration, the resistor R2 includes a first electrode coupled to a metal rail providing a ground voltage (e.g., GND or 0V), and a second electrode coupled to a source electrode of the transistor M9. In one configuration, the transistor M9 includes i) a source electrode coupled to the second electrode of the resistor R2, ii) a gate electrode to receive a signal 480A, and iii) a drain electrode coupled to the drain electrode of the transistor M1. The signal 480A may be or correspond to the signal 420B. In this configuration, the transistor M9 can operate as a switch. For example, when the signal 420B has a higher voltage than the signal 420A, such that the current from the adjustable current source 440 flows through the transistors M2, M4, M6, M8 as the current 328Xb, the transistor M9 can be enabled to provide a lower amount of current (or bleeding current) sufficient to ensure that the transistors M3, M5, M7 operate properly. For example, when the signal 420A has a higher voltage than the signal 420B, such that the current from the adjustable current source 440 flows through the transistors M1, M3, M5, M7 as the current 328X, the transistor M9 can be disabled from providing a current (or bleeding current).

) In one aspect, the transistor M10 and the resistor R3 may operate together to provide a current to ensure that the cascode transistors M4, M6, M8 operate properly, when a current from the adjustable current source 440 is provided as the current 328X through the transistors M1, M3, M5, M7. The current provided by the transistor M10 and the resistor R3 may be referred to as a bleeding current. The transistor M10 may be a MOSFET, a FinFET, a GaaFET, or any transistor. The transistor M10 may be a N-type transistor. In some embodiments, the transistor M10 may be implemented as a P-type transistor. In one configuration, the resistor R3 includes a first electrode coupled to a metal rail providing a ground voltage (e.g., GND or 0V), and a second electrode coupled to a source electrode of the transistor M10. In one configuration, the transistor M10 includes i) a source electrode coupled to the second electrode of the resistor R3, ii) a gate electrode to receive a signal 480B, and iii) a drain electrode coupled to the drain electrode of the transistor M2. The signal 480B may be or correspond to the signal 420A. In this configuration, the transistor M10 can operate as a switch. For example, when the signal 420A has a higher voltage than the signal 420B, such that the current from the adjustable current source 440 flows through the transistors M1, M3, M5, M7 as the current 328X, the transistor M10 can be enabled to provide a lower amount of current (or bleeding current) sufficient to ensure that the transistors M4, M6, M8 operate properly. For example, when the signal 420B has a higher voltage than the signal 420A, such that the current from the adjustable current source 440 flows through the transistors M2, M4, M6, M8 as the current 328Xb, the transistor M10 can be disabled from providing a current (or bleeding current).

In some embodiments, a calibration device or circuit can receive at least one signal from at least one DAC unit. The calibration circuit includes a chopper circuit that can receive the signals from the DAC units, a comparator circuit that can compare the signals received from the DAC in some embodiments. For example, the chopper circuit can receive a first signal from a first DAC unit and the chopper circuit can receive a second signal from a second DAC unit. The comparator circuit, using the first signal and the second signal, can produce a third signal. In some embodiments, the third signal can indicate at least one of the first signal or the second signal. In some embodiments, the comparator circuit can produce a voltage (e.g., a first offset voltage) that can interfere with at least one of the first signal, the second signal or the third signal. The first offset voltage can impact the effectiveness of the calibration device. The first offset voltage can be associated with the comparator circuit in some embodiments.

A first compensation loop (e.g., a first loop) is performed to reduce the impact that the voltage associated with the comparator circuit (e.g., the first offset voltage) has on the effectiveness of the calibration device in some embodiments. In some embodiments, the first compensation loop can be performed by a processing engine. The first compensation loop includes determining that the voltage associated with both the first signal and the second signal are zero in some embodiments. By determining that voltages of both the first signal and the second signal are zero the processing engine determines the value of the voltage associated with the comparator circuit in some embodiments. For example, when the voltage of both the first signal and the second signal are zero the voltage that is present at the output of the comparator circuit is a result of the voltage associated with the comparator circuit. The processing engine, in response to determining the voltage associated with the comparator circuit, can provide a fourth signal to a third DAC unit. The third DAC unit, in response to receiving the fourth signal from the processing engine, can provide, to the comparator circuit, a fifth signal that compensates for and/or offsets the voltage associated with the comparator circuit. The fifth signal can include a voltage that is equal in amplitude and opposite in polarity to that of the voltage associated with the comparator circuit.

The first compensation loop advantageously adjusts, modifies, alters or offsets the voltage associated with the comparator circuit in some embodiments. The first compensation loop can offset the voltage associated with the comparator circuit by offsetting the voltage associated with the comparator circuit to a value that is closer to zero when compared to the value of the voltage prior to the first compensation loop. For example, the voltage associated with the comparator circuit can be at or near 300 microvolts in some embodiments. The voltage associated with the comparator circuit can have a positive or a negative polarity. After the first compensation loop the voltage associated with the comparator circuit can be at or near 50 microvolts in some embodiments. The adjustment in the voltage associated with the comparator circuit increases the performance of the calibration device in some embodiments. The adjustment in the voltage associated with the comparator circuit reduces signal error in some embodiments. In some embodiments, the chopper circuit can produce a voltage (e.g., a second offset voltage) that can interfere with at least one of the first signal, the second signal or the third signal. The second offset voltage can impact the effectiveness of the calibration device. The second offset voltage can be associated with the chopper circuit A second compensation loop (e.g., a second loop) is performed to reduce the impact that the voltage associated with the chopper circuit (e.g., the second offset voltage) has on the effectiveness of the calibration device in some embodiments. The second compensation loop includes determining that the voltages associated with both the first signal and the second signal are zero in some embodiments. By determining that voltages of both the first signal and the second signal are zero the processing engine determines the value of the voltage associated with the chopping circuit in some embodiments. For example, when the voltage of both the first signal and the second signal are zero the voltage that is present at the output of the comparator circuit is a result of the voltage associated with the chopping circuit. The processing engine can provide a sixth signal to a fourth DAC unit. The fourth DAC unit can include a second chopper circuit in some embodiments. The fourth DAC unit, in response to receiving the sixth signal from the processing engine, can provide, to the chopper circuit, a seventh signal that offsets the voltage associated with the chopper circuit. The seventh signal can include a voltage that is equal in amplitude and opposite in polarity to that of the voltage associated with the chopper circuit. The processing engine is able to distinguish the first offset voltage associated with the comparator circuit and the second offset voltage associated with the chopper circuit as the first offset voltage is at least one of a Direct Current (DC) voltage or a DC signal and the second offset voltage is at least one of an Alternating Current (AC) voltage or an AC signal.

The second compensation loop advantageously reduces the offset voltage associated with the chopper circuit in some embodiments. The reduction in the offset voltage associated with the chopper circuit further increases the performance of the calibration device in some embodiments. For example, the second compensation loop can offset the voltage associated with the chopper circuit to 1 microvolt in some embodiments. The processing engine, the third DAC unit and the fourth DAC unit can be combined to create or including in a single component or circuit in some embodiments. For example, the processing engine, the third DAC unit and the fourth DAC unit can be included in a compensation circuit. The compensation circuit can perform similar functionality to at least one of the processing engine, the third DAC unit or the fourth DAC unit in some embodiments.

Figure 5:
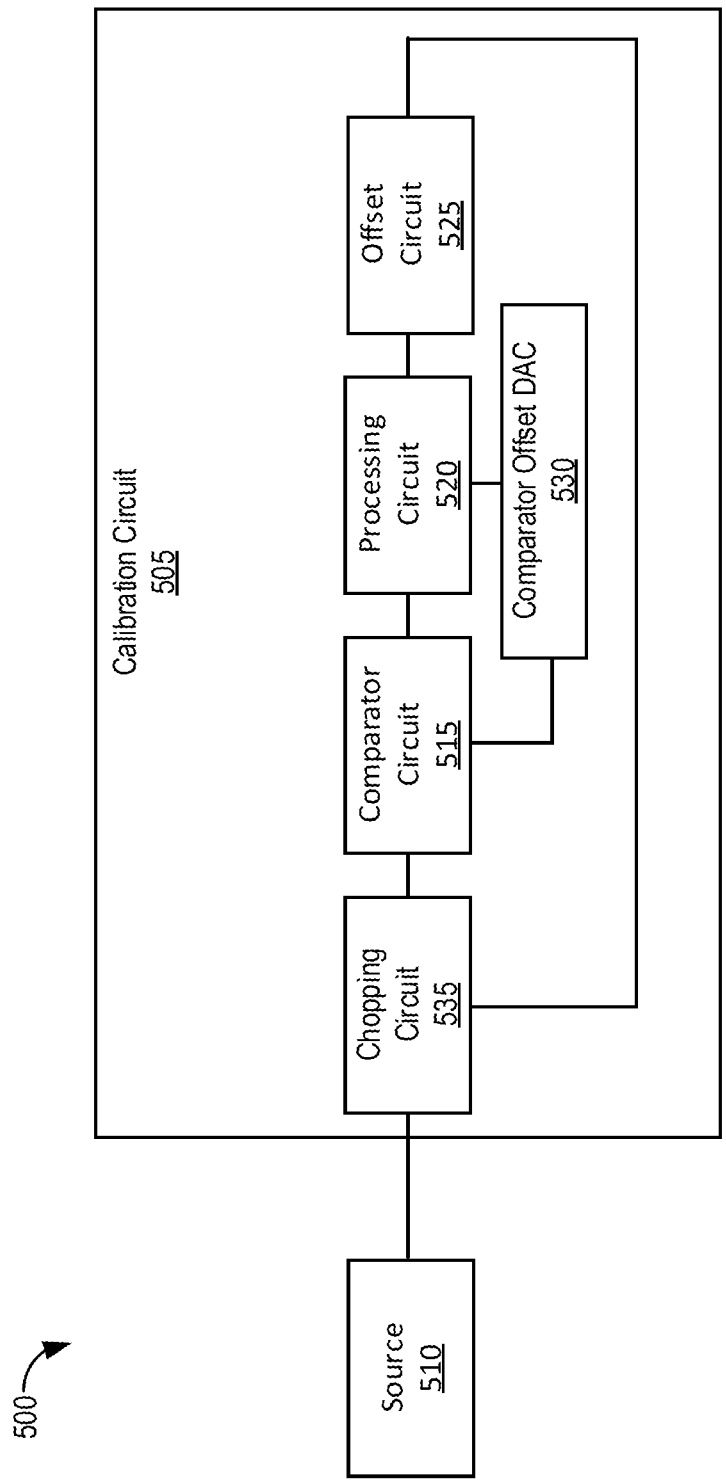
FIG. 5 is a schematic block diagram of a DAC system including a device for DAC calibration, according to some embodiments.

Referring now to FIG. 5, a DAC system 500 includes at least one calibration circuit 505 and at least one source 510. In some embodiments, the source 510 can be or include one or more DAC units (e.g., at least one of DAC cells 325A-N (FIG. 3). The source 510 (e.g., DAC unit) provides at least one signal to the calibration circuit 505. For example, the calibration circuit 505 can receive a first signal from a first DAC unit and the calibration circuit 505 can also receive a second signal from either the first DAC unit or a second DAC unit. The calibration circuit or device 505 can include at least one comparator circuit 515, at least one processing circuit 520, at least one offset circuit 525, at least one comparator offset DAC 530 and at least one chopping circuit 535 (e.g., a chopper circuit). A chopper circuit is any device for switching two signals (e.g., a circuit for switching inputs and providing the switched signal at an output in response to a signal at a frequency. In some embodiments, the processing circuit 520, the offset circuit 525 and/or the comparator offset DAC 530 can combined or included as a single component or circuit. For example, the processing circuit 520, the offset circuit 525 and the comparator offset DAC 530 can be combined or included in a compensation circuit. The compensation circuit can perform similar functionality to at least one of the processing circuit 520, the offset circuit 525 or the comparator offset DAC 530 in some embodiments.

The comparator circuit 515 can receive at least one signal and can produce at least one signal that indicates the received signal. For example, the comparator circuit 515 can receive a first signal and a second signal from the chopping circuit 535. The comparator circuit 515 can compare the first signal and the second signal to determine a difference between the first signal and the second signal. For example, the comparator circuit 515 can determine that the first signal is larger than the second signal, the comparator circuit 515 can determine that the first signal is smaller than the second signal, the comparator circuit 515 can determine that there is no difference between the first signal and the second signal. In some embodiments, the signal produced by the comparator circuit 515 indicates that the first signal is larger than the second signal. In some embodiments, the signal produced by the comparator circuit 515 indicates that the first signal is smaller than the second signal. In some embodiments, the comparator circuit 515 can include at least one operational amplifier (Opamp), at least one resistor and/or at least one capacitor. The comparator circuit 515 can provide, to the processing circuit 520, a signal that indicates at least one of the first signal or the second signal. The signal produced by the comparator circuit 515 can indicate the first signal when the first signal is larger than the second signal, when the first signal is smaller than the second signal and/or when the first signal is the same as the second signal.

The processing circuit 520 receives the signal produced by the comparator circuit 515 in some embodiments. In some embodiments, the processing circuit 520 can determine at least one of a voltage associated with the signal produced by the comparator circuit 515, a voltage associated with the comparator circuit 515 (e.g., a first offset voltage), a voltage associated with the first signal (e.g. the first signal from the DAC units), a voltage associated with the second signal (e.g., the second signal from the DAC units), or a voltage associated with the chopping circuit 535 (e.g., a second offset voltage). In some embodiments, the processing circuit 520 can provide signals to at least one of the comparator circuit 515, the offset circuit 525 or the comparator offset DAC 530. In some embodiments, the processing circuit 520 can be at least one of a hardware circuit, filters, a digital signal processing engine, a processor and memory or any other device that can detect the value of a signal. In some embodiments, the processing circuit 520 can include a digital averager component (e.g., a filter such as a low pass filter) and a pattern generator (e.g., a device that sends control signals to the source 510 and/or the DAC units).

The comparator offset DAC 530 can receive, in response to the processing circuit 520 determining the voltage associated with comparator circuit 515, a signal from the processing circuit 520. The signal can be an 8-bit signal in some embodiments. The signal can include the voltage associated with the comparator circuit 515 in some embodiments. The signal can include a voltage that has the same amplitude of the voltage associated with the comparator circuit 515 but the polarity of the voltage associated with the comparator circuit 515 and the voltage included in the signal are different. For example, the voltage associated with the comparator circuit 515 can be 1 volt and the voltage included in the signal that the processing circuit 520 provides to the DAC unit can be minus 1 volt. In this example, the amplitude of the two voltages are the same but the polarities are different (e.g., one is positive and the other is negative).

The comparator offset DAC 530 can offset the voltage associated with the comparator circuit 515. For example, the comparator offset DAC 530 can perform a first compensation loop. The first compensation loop can include the comparator offset DAC 530 offsetting, adjusting, modifying, changing or compensating the voltage associated with the comparator circuit 515. For example, the comparator offset DAC 530 can offset the voltage associated with the comparator circuit 515 by producing a signal that offsets the voltage associated with the comparator circuit 515. The signal can offset the voltage associated with the comparator circuit 515 by adjusting the value of the voltage associated with the comparator circuit 515. For example, the voltage associated with the comparator circuit 515 can be 100 microvolts and the voltage associated with the comparator circuit 515, in response to the comparator offset DAC 530 offsetting the voltage, can be adjusted to 20 microvolts. The first compensation loop prevents the voltage associated with the comparator circuit 515 from saturating the signal that indicates at least one of the first signal or the second signal that the comparator circuit 515 receives in some embodiments.

The offset circuit 525 can receive, in response to the processing circuit 520 determining the voltage associated with the chopping circuit 535, a signal from the processing circuit 520. The signal can be an 8-bit signal in some embodiments. The signal can include the voltage associated with the chopping circuit 535 in some embodiments. The signal can include a voltage that has the same amplitude of the voltage associated with the chopping circuit 535 but the polarity of the voltage associated with the chopping circuit 535 and the voltage included in the signal are different. For example, the voltage associated with the chopping circuit 535 can be 2 volts and the voltage included in the signal that the processing circuit 520 provides to the chopping circuit 535 can be minus 2 volts. In this example, the amplitude of the two voltages are the same but the polarities are different (e.g., one is positive and the other is negative).

The offset circuit 525 can offset the voltage associated with the chopping circuit 535. For example, the offset circuit 525 can perform a second compensation loop. The second compensation loop can include the offset circuit 525 offsetting, adjusting, modifying, changing or compensating the voltage associated with the chopping circuit 535. For example, the offset circuit 525 can offset the voltage associated with the chopping circuit 535 by producing a signal that decreases the voltage associated with the chopping circuit 535. The offset circuit 525 can provide, to the chopping circuit 535, the signal that decreases the voltage associated with the chopping circuit 535. In some embodiments, the offset circuit 525 can be a chopping circuit or a chopper circuit. In some embodiments, the offset circuit 525 can include at least one switch, at least one diode and/or at least one capacitor. In some embodiments, the second compensation loop prevents the voltage associated with the chopping circuit 535 from impacting the effectiveness of the calibration circuit 505 in some embodiments.

Figure 6:
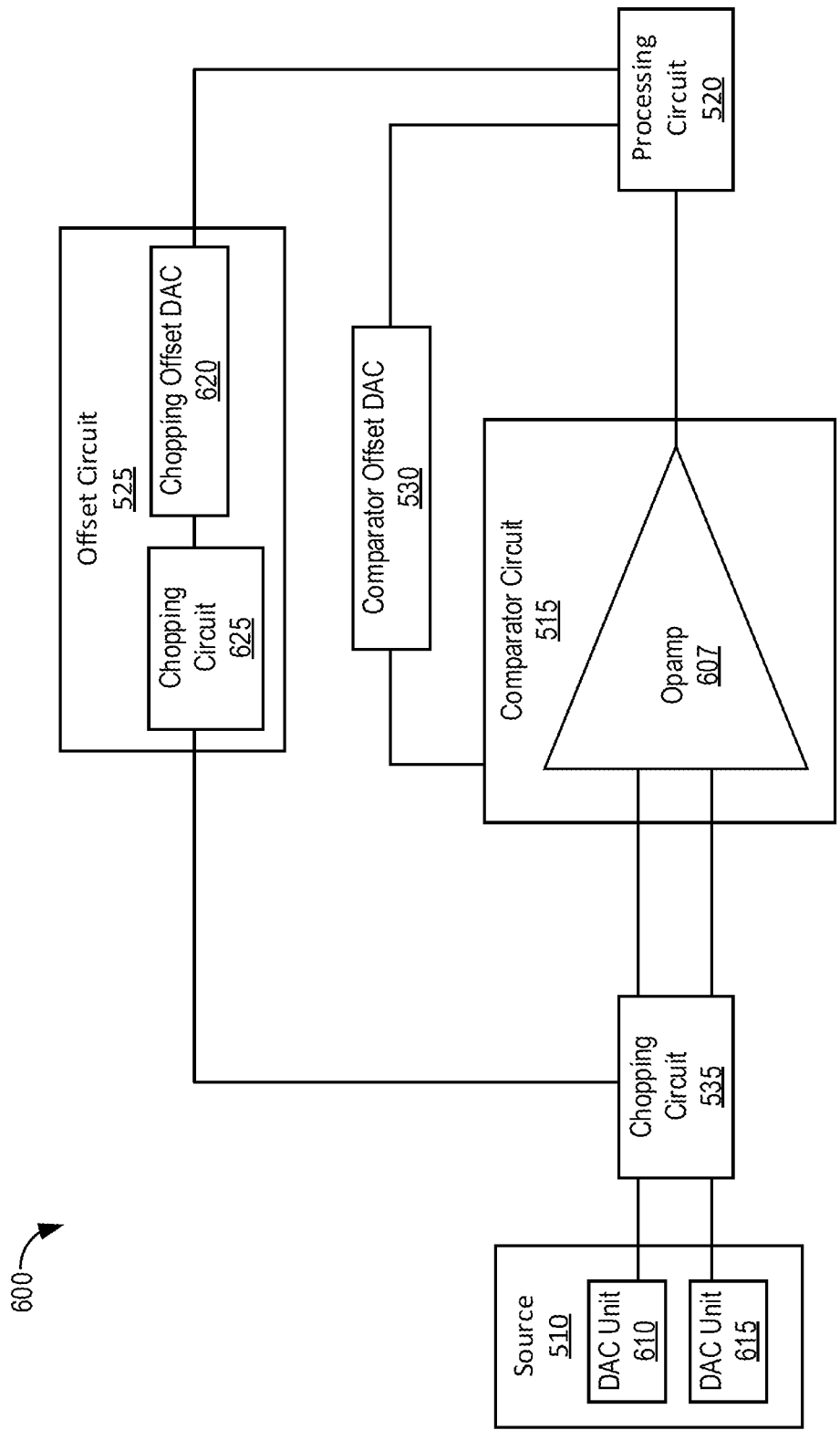
FIG. 6 is a schematic block diagram of a DAC system, according to some embodiments.

Referring now to FIG. 6, a DAC system 600 includes the source 510, the comparator circuit 515, the processing circuit 520, the offset circuit 525 and the chopping circuit 535. The source 510 includes at least one DAC unit 610 (e.g., at least one of DAC cells 325A-N (FIG. 3) and at least one DAC unit 615 (e.g., at least one of DAC cells 325A-N (FIG. 3). The DAC unit 610 and 615 can provide a signal to the chopping circuit 535. The chopping circuit 535 can receive a difference (e.g., a differential signal) between the DAC unit 610 and the DAC unit 615. The chopping circuit 535 can pass the differential signal to the comparator circuit 515 in at least one of a through-mode (e.g., the signal from the DAC unit 610 minus the signal from the DAC unit 615) and/or a cross-mode (e.g., the signal from the DAC unit 615 minus the signal from the DAC unit 610) in some embodiments. The chopping circuit 535 can alternate between through-mode and cross-mode and the chopping circuit 535 can alternate at a predetermined frequency (e.g., a chopping frequency). In through-mode the chopping circuit 535 can connect the signal from the DAC unit 610 to a positive terminal of the comparator circuit 515 and the chopping circuit 535 can connect the signal from the DAC unit 615 to a negative terminal of the comparator circuit 515 in some embodiments. In cross-mode the chopping circuit 535 can connect the signal from the DAC unit 610 to the negative terminal of the comparator circuit 515 and the chopping circuit 535 can connect the signal from the DAC unit 615 to the positive terminal of the comparator circuit 515 in some embodiments.

The offset circuit 525 can include at least one chopping offset DAC 620 and at least one chopping circuit 625 in some embodiments. The chopping offset DAC 620 can receive, from the processing circuit 520, a signal. The signal can include the voltage associated with the chopping circuit 535. The chopping offset DAC 620 can produce, in response to receiving the signal from the processing circuit 520, a signal that offsets the voltage associated with the chopping circuit 535 in some embodiments. The chopping offset DAC 620 can provide, to the chopping circuit 625, the signal that offsets the voltage associated with the chopping circuit 535 in some embodiments. The chopping circuit 625 can modify, in response to receiving the signal from the chopping offset DAC 620, the signal so that the signal is equal in both amplitude and frequency to that of the voltage associated with the chopping circuit 535 but opposite in polarity. The chopping circuit 625 can provide, to the chopping circuit 535, the signal that offsets the voltage associated with the chopping circuit 535 in some embodiments. As described herein the voltage associated with the chopping circuit 535 is an AC voltage and to offset the voltage associated with the chopping circuit 535 the offset circuit 525 produces an AC voltage that offsets the voltage associated with the chopping circuit 535 in some embodiments.

The comparator circuit 515 can include at least one Opamp 607. The Opamp 607 can receive at least one signal. The Opamp 607 can receive a signal from at least one of the DAC unit 610, the DAC unit 615, the chopping circuit 535, the offset circuit 525, the comparator offset DAC 530 or the processing circuit 520. The Opamp 607 can produce a signal that indicates at least one of the signals that the Opamp 607 can receive in some embodiments.

Figure 7:
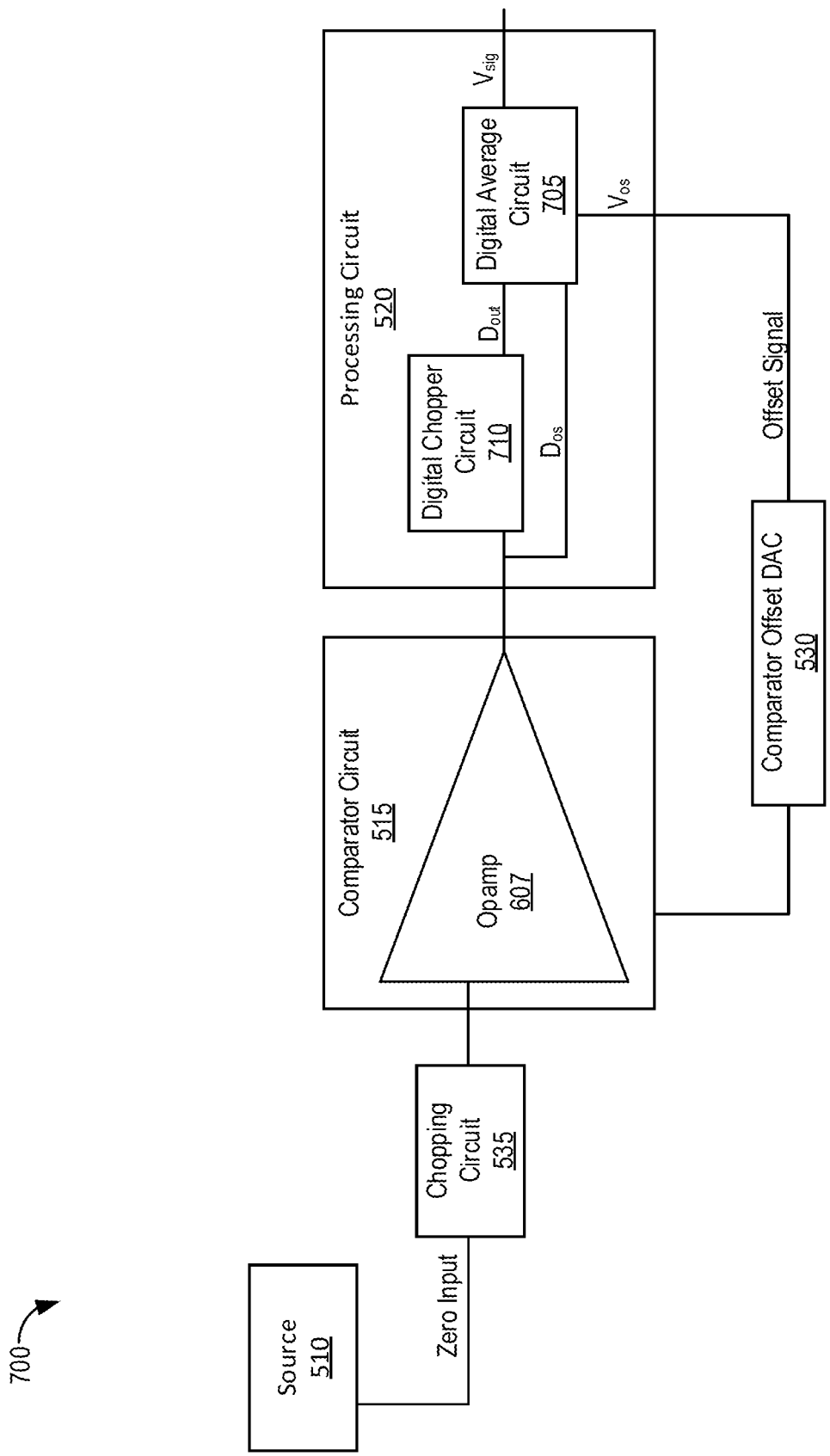
FIG. 7 is a schematic block diagram of a DAC system, according to some embodiments.

Referring now to FIG. 7, a DAC system 700 includes the source 510, the comparator circuit 515, the processing circuit 520, the comparator offset DAC 530 and the chopping circuit 535. The processing circuit 520 can include at least one digital average circuit 705 and at least one digital chopping circuit 710 in some embodiments. The digital average circuit 705 can receive at least one signal and the digital average circuit 705 can determine an average value for the signal. For example, the digital average circuit 705 can receive a first signal that includes a voltage of 2 volts and the digital average circuit 705 can receive a second signal that includes a voltage of 1 volts. The digital average circuit 705, in response to receiving the first signal and the second signal, can determine that the average value for the signal is 1.5 volts.

The digital chopper circuit 710 can modify, adjust, or otherwise change the signal that is produced by the comparator circuit 515 in some embodiments. For example, when the chopping circuit 535 is in through-mode (e.g. the positive input terminal of the chopping circuit 535 is connected to the positive input terminal of the comparator circuit 515 and the negative input terminal of the chopping circuit 535 is connected to the negative input terminal of the comparator circuit 515) the digital chopper circuit 710 will also be in through-mode. The digital chopper circuit 710 matching (e.g., the chopping circuit 535 and the digital chopper circuit 710 are both in through-mode) the mode of the chopping circuit 535 enables the signal that is produced by the comparator circuit 515 to have the same polarity as at least one of the signals from the DAC unit 610 and/or the DAC unit 615.

The digital average circuit 705 can receive a signal (e.g., a $D_{out}$ signal) from the digital chopper circuit 710 and the digital average circuit 705 can receive a signal (e.g. the $D_{os}$ signal) from the comparator circuit 515. As shown in FIG. 7, the source 510 is providing a zero input signal to the chopping circuit 535. The source 510 can provide a zero input signal by having the DAC unit 610 and the DAC unit 615 go silent. In some embodiments, the DAC unit 610 and the DAC unit 615 can go silent in response to the DAC unit 610 and the DAC unit 615 receiving, from the processing circuit 520 and/or the pattern generator, a signal. In some embodiments, the pattern generator can be separate circuit that is included in the calibration circuit 505. In some embodiments, the pattern generator can produce signals at a predetermined rate, frequency and/or value. The DAC unit 610 and the DAC unit 615 can go silent when the DAC unit 610 and the DAC unit 615 both produce signals that are the same (e.g., the signal produced by the DAC unit 610 matches, is the same, is similar to and/or is equal to the signal produced by the DAC unit 615).

As described herein the DAC unit 610 and the DAC unit 615 can include similar components to that of at least one of DAC cells 325A-N (FIG. 3). For example, the processing circuit 520 can provide a signal to at least one of the M1 and/or M2 transistors associated with the DAC unit 610. The processing circuit 520 can also provide a signal to at least one of the M1 and/or M2 transistors associated with the DAC unit 615. In some embodiments, the processing circuit 520 can provide a first fixed signal to the M1 transistor associated with the DAC unit 610 and the processing circuit 520 can also provide the first fixed signal to the M2 transistor associated with the DAC unit 615. In some embodiments, the processing circuit 520 can provide a second fixed signal to the M2 transistor associated with the DAC unit 610 and the processing circuit 520 can also provide the second fixed signal to the M1 transistor associated with the DAC unit 615. In some embodiments, the first and second fixed signals can cause the DAC unit 610 and the DAC unit 615 to produce signals that equal and/or similar to one another. The DAC unit 610 and the DAC unit 615 producing signals that are equal to one another, in response to receiving the fixed signals from the processing circuit 520, is an example of the DAC unit 610 and the DAC unit 615 being or going silent.

As described herein the signals that are provided, by the DAC unit 610 and the DAC unit 615, to the chopping circuit 535 are a differential signal (e.g., the signal produced by the DAC unit 610 minus the signal produced by the DAC unit 615). When the DAC unit 610 and the DAC unit 615 go silent the input to the chopping circuit 535 can be zero or near zero in some embodiments. At least one of the chopping circuit 535, the comparator circuit 515 and/or the processing circuit 520 can determine that the DAC unit 610 and the DAC unit 615 have gone silent.

The processing circuit 520, in response to determining that the DAC unit 610 and the DAC unit 615 have gone silent, can determine the voltage associated with the comparator circuit 515. For example, the digital average circuit 705 can determine the voltage associated with the comparator circuit 515 in response to detecting the $D_{os}$ signal in some embodiments. The $D_{os}$ signal, in response to the source 510 (e.g., the DAC unit 610 and the DAC unit 615) going silent, should be zero or near zero in some embodiments. In some embodiments, the digital average circuit 705 can determine that the $D_{os}$ signal is not near zero in some embodiments.

The processing circuit 520, in response to the digital average circuit 705 determining that the $D_{os}$ signal is not near zero, can determine that the $D_{os}$ signal includes a DC voltage and the processing circuit 520 can determine that the $D_{os}$ signal indicates the voltage associated with the comparator circuit 515 in some embodiments. As described herein the processing circuit 520 can differentiate the voltage associated with comparator circuit 515 and the voltage associated with the chopping circuit 535 given that the voltage associated with the comparator circuit 515 is a DC voltage and the voltage associated with the chopping circuit 535 is an AC voltage. The processing circuit 520, in response to determining the voltage associated with the comparator circuit 515, can provide a signal to the comparator offset DAC 530 in some embodiments. The comparator offset DAC 530 can provide, to the comparator circuit 515, a signal that offsets the voltage associated with the comparator circuit 515. The processing circuit 520 determining the voltage associated with the comparator circuit 515 and the comparator offset DAC 530 providing, to the comparator circuit 515, a signal that offsets the voltage associated with the comparator circuit 515 is a compensation loop in some embodiments.

Figure 8:
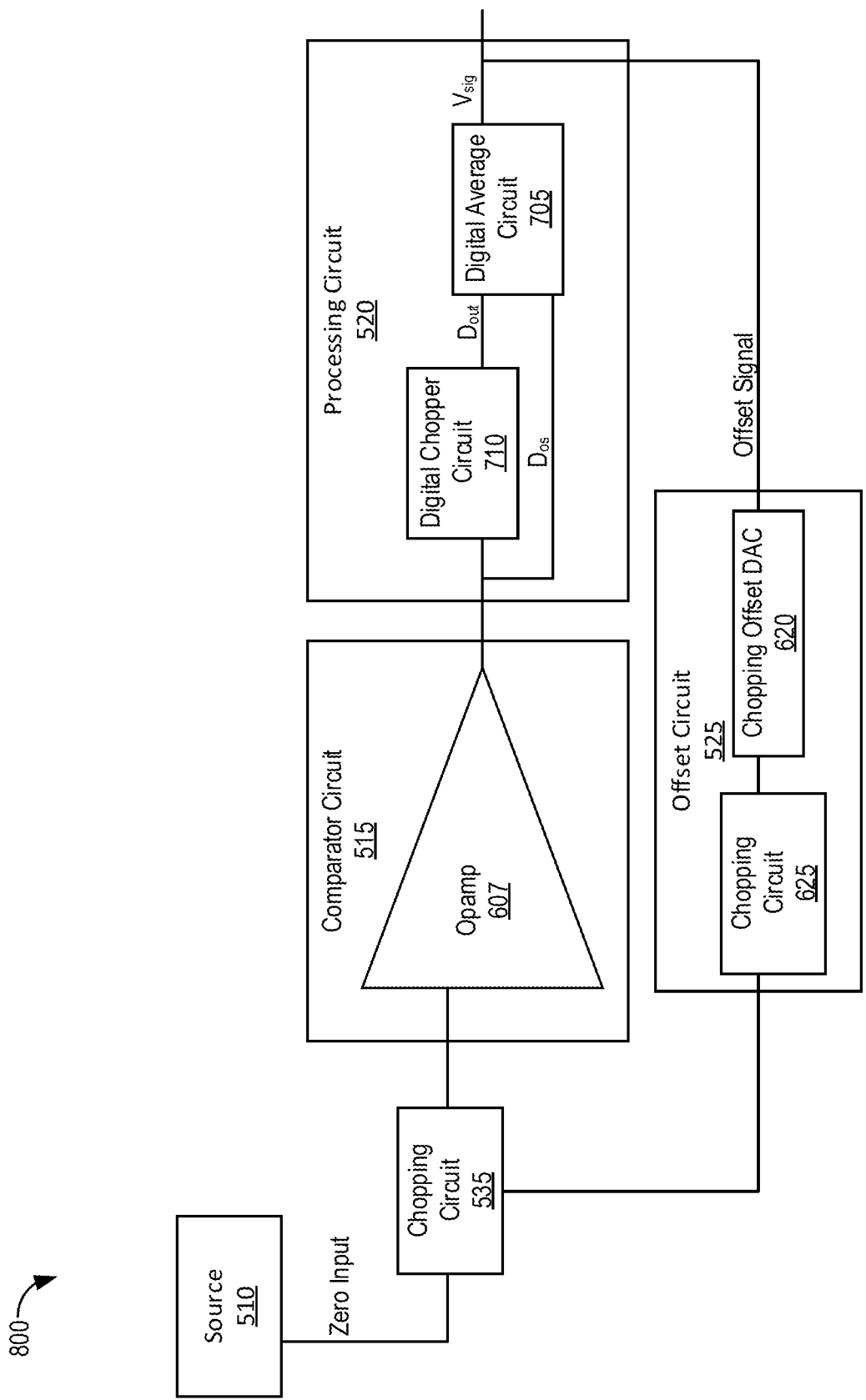
FIG. 8 is a schematic block diagram of a DAC system, according to some embodiments.

Referring now to FIG. 8, a DAC system 800 includes the source 510, the comparator circuit 515, the processing circuit 520, the offset circuit 525 and the chopping circuit 535. The digital average circuit 705 can receive a signal (e.g., a $D_{out}$ signal) from the digital chopper circuit 710 and a signal (e.g. the $D_{os}$ signal) from the comparator circuit 515. As shown in FIG. 8, the source 510 is providing a zero input signal (e.g., the source 510 has gone silent) to the chopping circuit 535. The processing circuit 520 can determine that the source 510 has gone silent in some embodiments.

The processing circuit 520 can, in response to determining that the source 510 has gone silent, determine the voltage associated with the chopping circuit 535. For example, the digital average circuit 705 can determine the voltage associated with the chopping circuit 535 in response to detecting the $D_{out}$ signal in some embodiments. The $D_{out}$ signal when the source 510 has gone silent should be zero or near zero in some embodiments. In some embodiments, the digital average circuit 705 can determine that the $D_{out}$ signal is not near zero in some embodiments.

The processing circuit 520, in response to the digital average circuit 705 determining that the $D_{out}$ signal is not near zero, can determine that the $D_{out}$ signal includes an AC voltage and the processing circuit 520 can determine that the $D_{out}$ signal indicates the voltage associated with chopping circuit 535 in some embodiments. The processing circuit 520, in response to determining the voltage associated with the chopping circuit 535, can provide a signal to the offset circuit 525 in some embodiments. The offset circuit 525 can provide, to the chopping circuit 535, a signal that offsets the voltage associated with the chopping circuit 535. The processing circuit 520 determining the voltage associated with the chopping circuit 535 and the offset circuit 525 providing, to the chopping circuit 535, a signal that offsets the voltage associated with the chopping circuit 535 is a compensation loop in some embodiments.

In some embodiments, the processing circuit 520, in response to the comparator offset DAC 530 offsetting the voltage associated with the comparator circuit 515 and the offset circuit 525 offsetting the voltage associated with the chopping circuit 535, can provide a signal (e.g., $V_{sig}$) that indicates at least one of the signals that the comparator circuit 515 received from the DAC unit 610 or the DAC unit 615.

Figure 9:
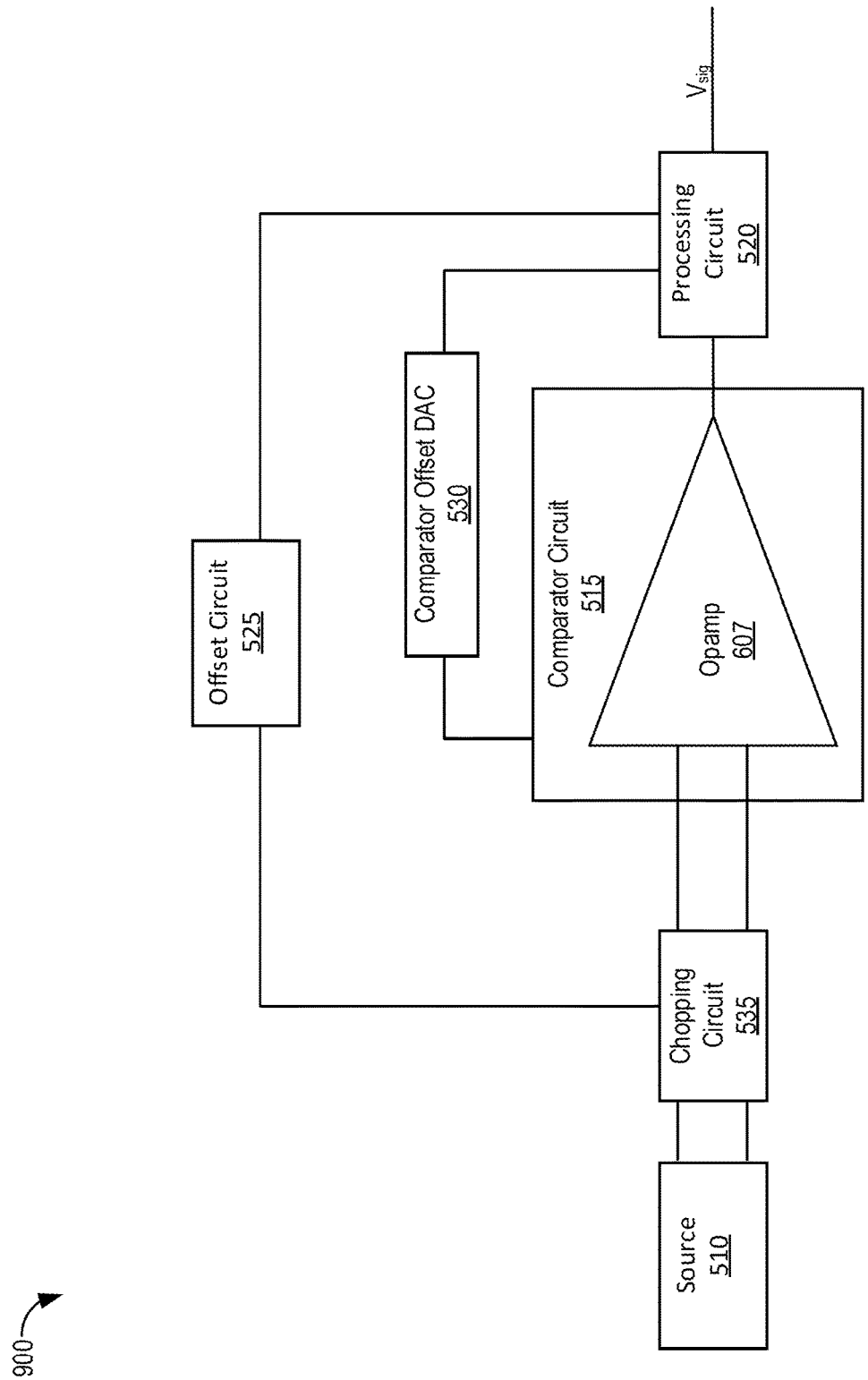
FIG. 9 is a schematic block diagram of a DAC system, according to some embodiments.

Referring now to FIG. 9, a DAC system 900 includes the source 510, the comparator circuit 515, the processing circuit 520, the offset circuit 525, the comparator offset DAC 530 and the chopping circuit 535. In some embodiments, the processing circuit 520 can implement, allow, permit or otherwise enable the DAC unit 610 and the DAC unit 615. In some embodiments, the processing circuit 520 can enable the DAC unit 610 and the DAC unit 615 by having the DAC unit 610 and the DAC unit 615 no longer be silent. In some embodiments, the voltage associated with the comparator circuit 515 has been offset by the comparator offset DAC 530. In some embodiments, the voltage associated with the chopping circuit 535 has been offset by the offset circuit 525. The chopping circuit 535 can receive at least one signal from the source 510. The comparator circuit 515 can receive at least one signal from the chopping circuit 535. In some embodiments, the comparator circuit 515 can receive a first signal and a second signal. The comparator circuit 515 can provide, to the processing circuit 520, a signal that indicates at least one of the first signal or the second signal in some embodiments. The processing circuit 520, in response to receiving the signal from the comparator circuit 515, can determine the value of the signal provided by the comparator circuit 515.

The processing circuit 520, in response to determining the value of the signal provided by the comparator circuit 515, can provide a signal (e.g., $V_{sig}$) to at least one external system. In some embodiments, the $V_{sig}$ can be used to calibrate at least one digital to analog convertor. For example, the $V_{sig}$ can provide an indication of the difference between two DAC units (e.g., the DAC unit 610 and the DAC unit 615). A digital to analog convertor can be composed of at least one DAC unit. The $V_{sig}$ can be used to determine which DAC unit is producing at least one of a signal that is higher than a second digital to analog convertor signal, a signal that is lower than a second digital to analog convertor signal or a signal that is the same as a second digital to analog convertor signal.

The ability to compare the signals produced by two DAC units enables the system to calibrate the digital to analog convertors so that the digital to analog convertors both produce a signal that is equal to one another in some embodiments. For example, a first digital to analog convertor produces a signal equal to 1 and a second digital to analog convertor produces a signal equal to 2. The $V_{sig}$ can be used to indicate that the signal produced by the second digital to analog convertor is higher than the signal produced by the first digital to analog convertor in some embodiments. In some embodiments, at least one of the first or second digital to analog convertor can be adjusted, modified or changed so that the signal produced by the first and the second digital to analog convertor have the same signal value.

Figure 10:
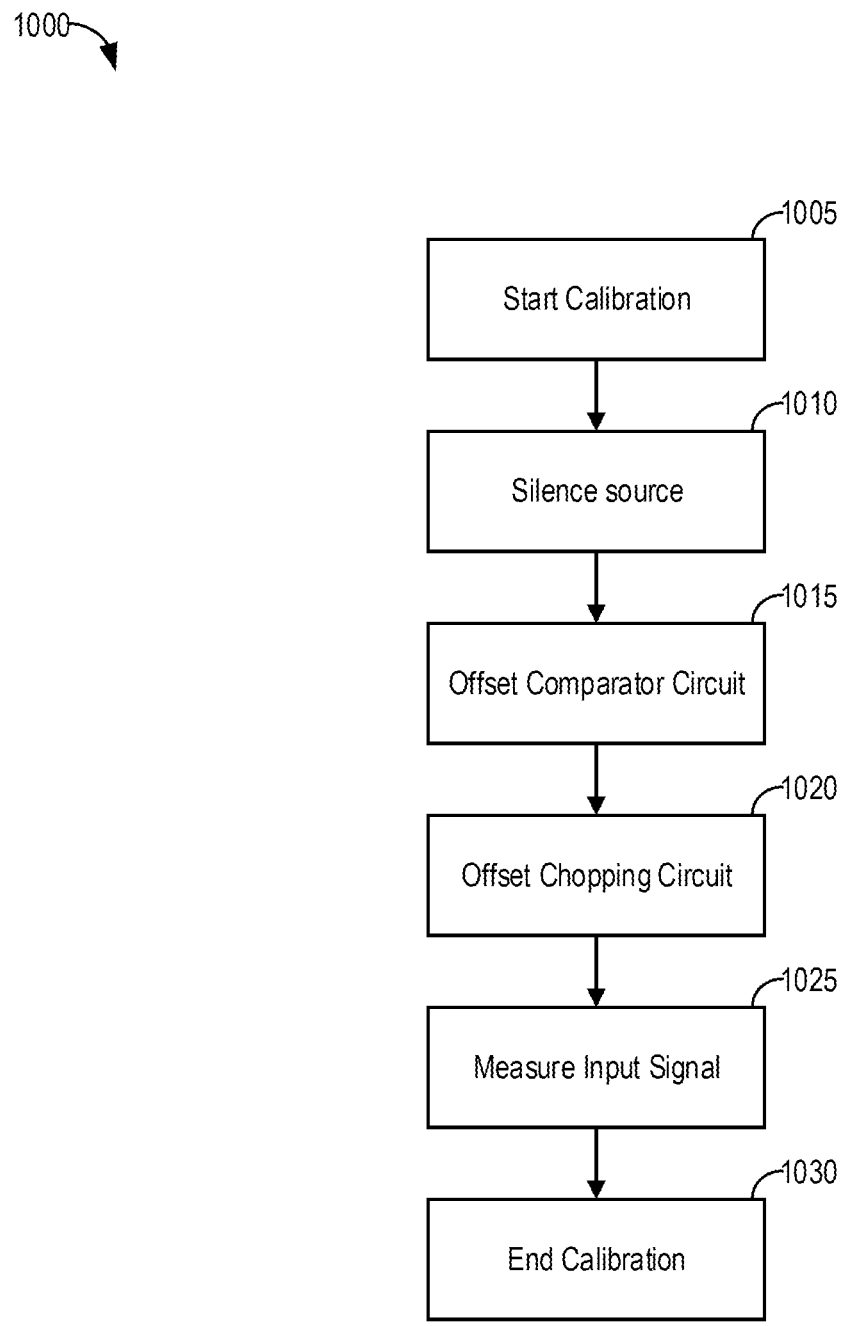
FIG. 10 is a flow diagram of an operations for calibrating a digital to analog convertor, according to some embodiments.

Referring now to FIG. 10, a flow 1000 for calibrating a digital to analog convertor is shown, according to some embodiments. At least one the steps of the flow 1000 can be performed by the calibration circuit 505 and/or a component of the calibration circuit 505 (e.g., the processing circuit 520) in some embodiments. In operation 1005, calibration starts. For example, the calibration can start by the comparator circuit 515 receiving a signal from the chopping circuit 535. The processing circuit 520, in response to the comparator circuit 515 receiving the signal from the chopping circuit 535, can initiate at least one compensation loop.

In operation 1010, the processing circuit 520 can silence the source 510. For example, the processing circuit 520 can provide a signal to the DAC unit 610 and the DAC unit 615 that causes the DAC unit 610 and the DAC unit 615 to go silent. The processing circuit 520 can, in response to determining that the DAC unit 610 and the DAC unit 615 have gone silent, determine at least one of the voltage associated with the comparator circuit 515 or the voltage associated with the chopping circuit 535.

The processing circuit 520 can provide, in response to determining the voltage associated with the comparator circuit 515, a first signal to the comparator offset DAC 530. The first signal can include the voltage associated with the comparator circuit 515 in some embodiments. The processing circuit 520 can provide, in response to determining the voltage associated with the chopping circuit 535, a second signal to the offset circuit 525. The signal can include the voltage associated with the chopping circuit 535. The processing circuit 520 can determine the voltage associated with comparator circuit 515 by detecting a signal produced by the comparator circuit 515 in some embodiments. In operation 1010, in response to the DAC unit 610 and the DAC unit 615 going silent, the input signal was zero. Given that the input signal was zero and that the comparator circuit 515 has produced a signal the processing circuit 520 can determine the voltage associated with at least one of the comparator circuit 515 or the chopping circuit 535 in some embodiments.

The processing circuit 520 can determine that the signal produced by the comparator circuit 515 indicates the voltage associated with the comparator circuit 515 when the signal produced by the comparator circuit 515 includes a DC voltage in some embodiments. The processing circuit 520 can determine that the signal produced by the comparator circuit 515 indicates the voltage associated with the chopping circuit 535 when the signal produced by the comparator circuit 515 includes an AC voltage in some embodiments.

In operation 1015, the voltage associated with the comparator circuit 515 is offset. In some embodiments, the comparator offset DAC 530 can receive, from the processing circuit 520, a signal that includes the voltage associated with the comparator circuit 515. The comparator offset DAC 530, in response to receiving the signal from the processing circuit 520, can provide, to the comparator circuit 515, a signal that offsets the voltage associated with the comparator circuit 515.

In operation 1020, the voltage associated with the chopping circuit 535 is offset. In some embodiments, the offset circuit 525 can receive, from the processing circuit 520, a signal that includes the voltage associated with the chopping circuit 535. The offset circuit 525, in response to receiving the signal from the processing circuit 520, can provide, to the chopping circuit 535, a signal that offsets the voltage associated with the chopping circuit 535.

In operation 1025, the processing circuit 520 can measure the signal (e.g., $V_{sig}$) that the comparator circuit 515 received in operation 1005. In some embodiments, the processing circuit 520 measures the signal in response to the comparator offset DAC 530 offsetting the voltage associated with the comparator circuit 515 and the offset circuit 525 offsetting the voltage associated with the chopping circuit 535. The processing circuit 520 waiting to measure the signal that the comparator circuit 515 received in operation 1005 enhances the accuracy of the calibration circuit 505. In operation 1030, the calibration ends. In some embodiments, the calibration ends in response to the processing circuit 520 measuring the signal that the comparator circuit 515 received.

As described herein the first compensation and the second compensation loop can enhance the calibration circuit 505 by decreasing the error associated with the signal that is produced by the comparator circuit 515. For example, the offsetting of the voltage associated with the comparator circuit 515 decreases the error of the signal that is produced by the comparator circuit 515 because the voltage associated with the comparator circuit 515 can saturate the signal produced by the comparator circuit 515 and the first compensation loop can reduce the saturation of the signal produced by the comparator circuit 515. Additionally, the offsetting of the voltage associated with the chopping circuit 535 decreases the error of the signal that is produced by the chopping circuit 535. The voltage associated with the chopping circuit 535 can modify or change at least one of the voltage associated with the first signal or the voltage associated with the second signal and the second compensation loop can reduce the modifying of the voltage associated with the first signal or the voltage associated with the second signal. The error of the signal is produced by imperfections of the chopping circuit 535 in some embodiments.

The hardware system may be implemented in many different ways and in many different combinations of hardware and software and circuit designs. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLO), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. In some embodiments, the circuitry for calibration operations and the cells can be provided on one or more integrated circuit dies in an integrated circuit package. The integrated circuit package can be a combination of two or more packages in some embodiments.

The circuitry may further include or access instructions (e.g., software or firmware) for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HOD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible.

What is claimed is:

1. A calibration system for a circuit in an integrated circuit package, the circuit comprising a plurality of cells, the calibration system comprising:
 a chopper circuit configured to receive a first signal from a first cell of the plurality of cells and a second signal from a second cell of the plurality of cells;

a comparator circuit configured to:
  receive the first signal and the second signal from the chopper circuit; and
  provide a third signal indicating at least one of the first signal or the second signal for use in calibration; and
a compensation circuit configured to offset a first voltage associated with the comparator circuit and configured to offset a second voltage associated with the chopper circuit;
wherein the compensation circuit includes at least one digital to analog convertor cell and at least one chopper circuit.

2. The calibration system of claim 1,
wherein the compensation circuit is configured to:
  determine that the first signal and the second signal are the same; and
  determine the first voltage associated with the comparator circuit in response to the compensation circuit detecting a third voltage associated with the third signal;
  wherein the third voltage associated with the third signal indicates the first voltage associated with the comparator circuit.

3. The calibration system of claim 2,
wherein the compensation circuit is configured to:
  provide, in response to the compensation circuit determining the first voltage associated with the comparator circuit, a fourth signal to the comparator circuit;
  wherein the fourth signal includes a fourth voltage that offsets the first voltage associated with the comparator circuit.

4. The calibration system of claim 1,
wherein the compensation circuit is configured to:
  determine that the first signal and the second signal are the same; and
  determine the second voltage associated with the chopper circuit in response to the compensation circuit detecting a fifth voltage associated with the third signal;
  wherein the fifth voltage associated with the third signal indicates the second voltage associated with the chopper circuit.

5. The calibration system of claim 4,
wherein the compensation circuit is configured to:
  provide, in response to the compensation circuit determining the second voltage associated with the chopper circuit, a fifth signal to the chopper circuit;
  wherein the fifth signal includes a sixth voltage that offsets the second voltage associated with the chopper circuit.

6. The calibration system of claim 1,
wherein the compensation circuit is configured to:
  provide a sixth signal, wherein the sixth signal indicates at least one of the first signal or the second signal;
  wherein the compensation circuit provides the sixth signal in response to the compensation circuit offsetting the first voltage associated with the comparator circuit.

7. The calibration system of claim 1,
wherein the compensation circuit is configured to:
  provide a seventh voltage that offsets the first voltage associated with the comparator circuit;
  wherein the seventh voltage includes a first polarity that is different than a second polarity, wherein the first voltage associated with the comparator circuit includes the second polarity.

8. The calibration system of claim 1;
wherein the compensation circuit is configured to:
  provide an eighth voltage that offsets the second voltage associated with the chopper circuit;
  wherein the eighth voltage includes a third polarity that is different than a fourth polarity, wherein the second voltage associated with the chopper circuit includes the fourth polarity.

9. A calibration circuit comprising:
a chopper circuit configured to receive a first signal and a second signal;
a comparator circuit configured to:
  receive the first signal and the second signal from the chopper circuit; and
  provide a third signal indicating at least one of the first signal or the second signal; and
a second circuit configured to:
  provide a first loop to adjust a first offset voltage associated with the comparator circuit and to provide a second loop to adjust a second offset voltage associated with the chopper circuit;
  determine that the first signal and the second signal are the same; and
  determine the first offset voltage associated with the comparator circuit in response to the second circuit detecting a first voltage associated with the third signal;
  wherein the first voltage associated with the third signal indicates the first offset voltage associated with the comparator circuit.

10. The calibration circuit of claim 9, wherein the second circuit further comprises:
a third circuit configured to:
  receive a fourth signal that includes the first offset voltage associated with the comparator circuit; and
  provide a fifth signal to the comparator circuit, wherein the fifth signal includes a second voltage that offsets the first offset voltage associated with comparator circuit.

11. The calibration circuit of claim 9, wherein the second circuit is configured to:
  determine that the first signal and the second signal are the same; and
  determine the second offset voltage associated with the chopper circuit in response to the second circuit detecting a third voltage associated with the third signal;
  wherein the third voltage associated with the third signal indicates the second offset voltage associated with the chopper circuit.

12. The calibration circuit of claim 11, wherein the second circuit further comprises:
a fourth circuit configured to:
  receive a sixth signal that includes the second offset voltage associated with the chopper circuit; and
  provide a seventh signal to the chopper circuit, wherein the seventh signal includes a fourth voltage that offsets the second offset voltage associated with the chopper circuit.

13. The calibration circuit of claim 9,
wherein the second circuit is configured to:
  provide an eighth signal, wherein the eighth signal indicates at least one of the first signal or the second signal;
  wherein the second circuit provides the eighth signal in response to the second circuit providing the first loop and the second loop.

14. The calibration circuit of claim 9, wherein the second circuit further comprises:
a third circuit configured to:
provide a fifth voltage that offsets the first offset voltage associated with the comparator circuit;
wherein the fifth voltage includes a first polarity that is different than a second polarity, wherein the first offset voltage associated with the comparator circuit includes the second polarity.

15. The calibration circuit of claim 9, wherein the second circuit further comprises:
a fourth circuit configured to:
provide a sixth voltage that offsets the second offset voltage associated with the chopper circuit;
wherein the sixth voltage includes a third polarity that is different than a fourth polarity, wherein the second offset voltage associated with the chopper circuit includes the fourth polarity.

16. A method of adjusting a calibration circuit, the calibration circuit comprising a comparator, DAC cells, and a chopper circuit, the method comprising:

adjusting a first offset voltage associated with the comparator;
adjusting a second offset voltage associated with the chopper circuit; and
providing, by a third circuit, a first voltage that offsets the first offset voltage associated with the comparator;
wherein the first voltage has a first polarity that is different than a second polarity, wherein the first offset voltage associated with the comparator includes the second polarity.

17. The method of claim 16, further comprising:
providing, by a fourth circuit, a second voltage that offsets the second offset voltage associated with the chopper circuit;
wherein the second voltage has a third polarity that is different than a fourth polarity, wherein the second offset voltage associated with the chopper circuit includes the fourth polarity.

* * * * *